(12) United States Patent
Wu et al.

(10) Patent No.: US 12,217,789 B2
(45) Date of Patent: *Feb. 4, 2025

(54) CONTROL AMPLIFICATION CIRCUIT, SENSITIVE AMPLIFIER AND SEMICONDUCTOR MEMORY

(71) Applicant: CHANGXIN MEMORY TECHNOLOGIES, INC., Hefei (CN)

(72) Inventors: Daoxun Wu, Hefei (CN); Weibing Shang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 326 days.

This patent is subject to a terminal disclaimer.

(21) Appl. No.: 17/844,259

(22) Filed: Jun. 20, 2022

(65) Prior Publication Data
US 2023/0215491 A1    Jul. 6, 2023

Related U.S. Application Data

(63) Continuation of application No. PCT/CN2022/079712, filed on Mar. 8, 2022.

(30) Foreign Application Priority Data

Dec. 31, 2021 (CN) .......................... 202111663568.8

(51) Int. Cl.
*G11C 11/00* (2006.01)
*G11C 11/4091* (2006.01)

(52) U.S. Cl.
CPC ................... *G11C 11/4091* (2013.01)

(58) Field of Classification Search
CPC ..... G11C 16/10; G11C 16/0408; G11C 16/08; G11C 16/24; G11C 16/28; G11C 16/30;
(Continued)

(56) References Cited

U.S. PATENT DOCUMENTS

| 5,396,465 A | 3/1995 | Oh |
| 5,506,524 A | 4/1996 | Lin |

(Continued)

FOREIGN PATENT DOCUMENTS

| CN | 101562042 A | 10/2009 |
| CN | 104078078 A | 10/2014 |

(Continued)

OTHER PUBLICATIONS

First Office Action of the Taiwanese application No. 111127066, issued on Aug. 28, 2023. 6 pages with English abstract.

(Continued)

*Primary Examiner* — Hien N Nguyen
(74) *Attorney, Agent, or Firm* — Syncoda LLC; Feng Ma

(57) ABSTRACT

Embodiments of the disclosure provide a control amplification circuit, a sensitive amplifier and a semiconductor memory. The control amplification circuit includes: a power consumption control circuit, configured to receive a power consumption control signal and output a first reference signal according to the power consumption control signal; an isolating circuit, configured to determine a control instruction signal and generate an isolation control signal according to the control instruction signal; and an amplification circuit, configured to receive the first reference signal, the isolation control signal and a signal to be processed, and process the signal to be processed based on the first reference signal and the isolation control signal to obtain a target amplified signal.

20 Claims, 17 Drawing Sheets

(58) Field of Classification Search
CPC ............ G11C 11/5628; G11C 11/5671; G11C 16/0483; G11C 16/3404
See application file for complete search history.

(56) References Cited

U.S. PATENT DOCUMENTS

| | | | |
|---|---|---|---|
| 5,701,268 | A | 12/1997 | Lee et al. |
| 6,147,925 | A | 11/2000 | Tomishima |
| 6,614,702 | B2 | 9/2003 | Lee |
| 7,102,947 | B2 | 9/2006 | Kajitani |
| 11,894,048 | B2 * | 2/2024 | Shang ..................... G11C 7/08 |
| 2003/0002353 | A1 | 1/2003 | Lee |
| 2003/0043668 | A1 | 3/2003 | Wickman |
| 2006/0023535 | A1 | 2/2006 | Chun |
| 2008/0151664 | A1 | 6/2008 | Kim |
| 2009/0051406 | A1 * | 2/2009 | Kawasaki ........ G01R 31/31721 327/419 |
| 2011/0044121 | A1 | 2/2011 | Kim et al. |
| 2014/0077884 | A1 | 3/2014 | Huynh |
| 2016/0197587 | A1 | 7/2016 | Arknæs-Pedersen |
| 2018/0061461 | A1 | 3/2018 | Seo |
| 2019/0392873 | A1 | 12/2019 | Kuroda |
| 2020/0027490 | A1 | 1/2020 | Ingalls |
| 2020/0099353 | A1 | 3/2020 | Danyuk et al. |
| 2022/0028446 | A1 | 1/2022 | Peng et al. |
| 2022/0270653 | A1 * | 8/2022 | Cao ......................... G11C 7/08 |
| 2023/0005523 | A1 * | 1/2023 | Chi ......................... G11C 7/12 |
| 2023/0230631 | A1 * | 7/2023 | Wu ..................... G11C 11/4091 365/207 |

FOREIGN PATENT DOCUMENTS

| | | |
|---|---|---|
| CN | 105763162 A | 7/2016 |
| CN | 110729000 A | 1/2020 |
| CN | 111179983 A | 5/2020 |
| CN | 111863049 A | 10/2020 |
| CN | 111863051 A | 10/2020 |
| CN | 112712837 A | 4/2021 |
| CN | 112767975 A | 5/2021 |
| JP | H11273346 A | 10/1999 |
| TW | I222641 | 10/2004 |

OTHER PUBLICATIONS

International Search Report in the international application No. PCT/CN2022/079726, mailed on Sep. 26, 2022. 5 pages with English translation.

International Search Report in the international application No. PCT/CN2022/079712, mailed on Aug. 25, 2022. 5 pages with English translation.

International Search Report in the international application No. PCT/CN2022/079701, mailed on Oct. 8, 2022. 6 pages with English translation.

Extended European Search Report in application No. 22912974, mailed on Jul. 16, 2024.

* cited by examiner

CONTROL AMPLIFICATION CIRCUIT, SENSITIVE AMPLIFIER AND SEMICONDUCTOR MEMORY

CROSS-REFERENCE TO RELATED APPLICATIONS

This application is a continuation of International Application No. PCT/CN2022/079712, filed on Mar. 8, 2022, which is based upon and claims priority to Chinese patent application No. 202111663568.8, filed on Dec. 31, 2021 and entitled "CONTROL AMPLIFICATION CIRCUIT, SENSITIVE AMPLIFIER AND SEMICONDUCTOR MEMORY". The contents of International Application No. PCT/CN2022/079712 and Chinese patent application No. 202111663568.8 are hereby incorporated by reference in their entireties.

BACKGROUND

A Dynamic Random Access Memory (DRAM) is a semiconductor storage device commonly used in computers, and includes many repeated storage cells. During read-out of data, a read-out data signal of each storage unit is read out through a local data line, a global data line and a data bus sequentially; conversely, during write-in of data, a write-in data signal is written to the storage unit through the data bus, the global data line and the local data line sequentially.

At present, a sensitive amplifier exists between the storage unit and the local data line to improve the signal quality of content for the storage unit. Stored data or data to be stored needs to be read or written after being amplified by the sensitive amplifier, but signal amplification is high in power consumption.

SUMMARY

The disclosure relates to the technical field of semiconductor memories, and in particular to a control amplification circuit, a sensitive amplifier and a semiconductor memory.

A technical solution of the disclosure is implemented as follows.

In a first aspect, embodiments of the disclosure provide a control amplification circuit, which may include: a power consumption control circuit, an isolating circuit, and an amplification circuit. The power consumption control circuit is configured to receive a power consumption control signal and output a first reference signal according to the power consumption control signal. The isolating circuit is configured to determine a control instruction signal and generate an isolation control signal according to the control instruction signal. The amplification circuit is configured to receive the first reference signal, the isolation control signal and a signal to be processed, and process the signal to be processed based on the first reference signal and the isolation control signal to obtain a target amplified signal.

In a second aspect, the embodiments of the disclosure provide a sensitive amplifier, which may include a control amplification circuit. The control amplification circuit includes a power consumption control circuit, an isolating circuit, and an amplification circuit. The power consumption control circuit is configured to receive a power consumption control signal and output a first reference signal according to the power consumption control signal. The isolating circuit is configured to determine a control instruction signal and generate an isolation control signal according to the control instruction signal. The amplification circuit is configured to receive the first reference signal, the isolation control signal and a signal to be processed, and process the signal to be processed based on the first reference signal and the isolation control signal to obtain a target amplified signal.

In a third aspect, the embodiments of the disclosure provide a semiconductor memory, which may include a sensitive amplifier. The sensitive amplifier includes a control amplification circuit. The control amplification circuit includes a power consumption control circuit, an isolating circuit, and an amplification circuit. The power consumption control circuit is configured to receive a power consumption control signal and output a first reference signal according to the power consumption control signal. The isolating circuit is configured to determine a control instruction signal and generate an isolation control signal according to the control instruction signal. The amplification circuit is configured to receive the first reference signal, the isolation control signal and a signal to be processed, and process the signal to be processed based on the first reference signal and the isolation control signal to obtain a target amplified signal.

DETAILED DESCRIPTION

The technical solutions in the embodiments of the disclosure are clearly and completely described below in combination with the accompanying drawings in the embodiments of the disclosure. It is understandable that the specific embodiments described here are used only to explain the disclosure rather than limiting. It is to be noted that for ease of description, only those parts relevant to the disclosure are shown in the accompanying drawings.

Unless otherwise defined, all technical and scientific terms in the specification have the same meaning as those skilled in the art usually understand. Terms used in the specification are only used for describing the purpose of the embodiments of the disclosure, but not intended to limit the disclosure.

"Some embodiments" involved in the following descriptions describes a subset of all possible embodiments. However, it can be understood that "some embodiments" may be the same subset or different subsets of all the possible embodiments, and may be combined without conflicts.

It should be pointed out that term "first/second/third" involved in the embodiments of the disclosure is only for distinguishing similar objects and does not represent a specific sequence of the objects. Understandably, "first/second/third" are interchangeable in specific sequences or orders when allowable, to implement the embodiments of the disclosure described herein in sequences other than those illustrated or described herein.

P-type FET: hole-type FET;

N-type FET: electron-type FET.

Figure 1:
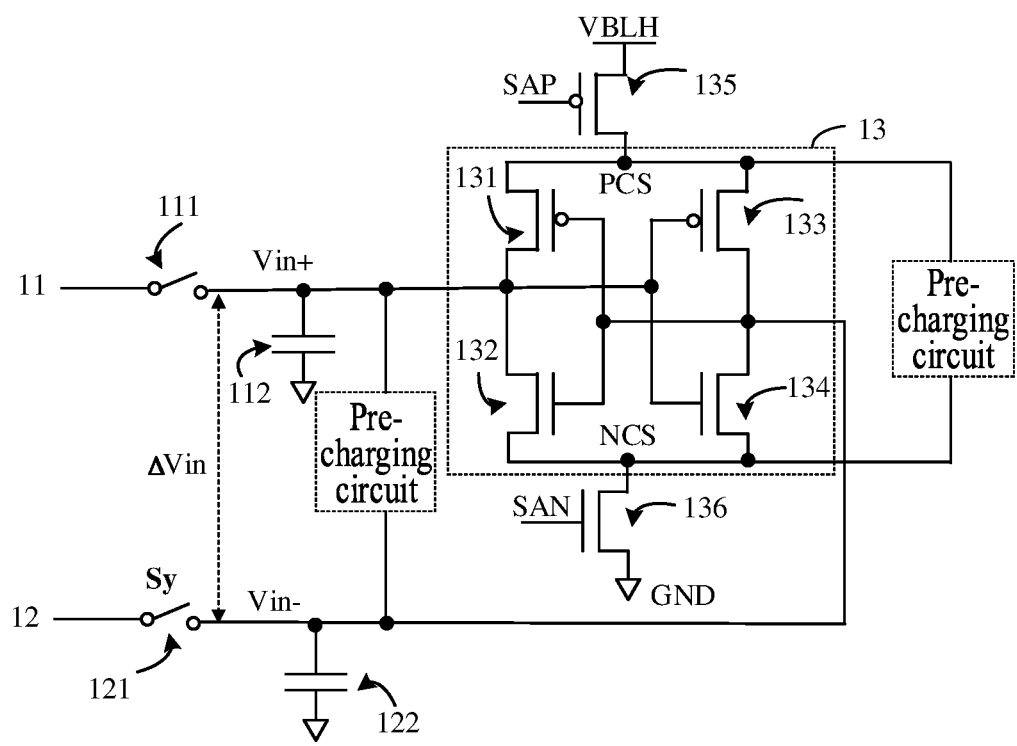
FIG. 1 illustrates a schematic diagram of an application scenario of a sensitive amplifier.

Understandably, during operation of a DRAM, a sensitive amplifier needs to be used to perform signal amplification in various operation processes. FIG. 1 illustrates a schematic diagram of an application scenario of a sensitive amplifier. As illustrated in FIG. 1, the application scenario includes a first signal line 11, a second signal line 12 and a sensitive amplifier 13.

A first switch 111 and a first capacitor 112 are provided on the first signal line 11 for transmitting a signal Vin+ to be processed. A second switch 121 and a second capacitor 122 are provided on the second signal line 12 for transmitting a reference signal Vin− to be processed. A voltage difference between the signal Vin+ to be processed and the reference signal Vin− to be processed is ΔVin. The sensitive amplifier 113 is configured to amplify the signal Vin+ to be processed and the reference signal Vin− to be processed. Here, the first switch 111 and the first capacitor 112 may be regarded as a storage unit, and the second switch 121 and the second capacitor 122 may be regarded as another storage unit.

Specifically, the sensitive amplifier includes a first switch tube 131, a second switch tube 132, a third switch tube 133 and a fourth switch tube 134, which are all connected to the reference signal Vin− to be processed. A third end of the first switch tube 131, a second end of the second switch tube 132, a first end of the third switch tube 133 and a first end of the fourth switch tube 134 are all connected to the signal Vin+ to be processed. There are also a fifth switch tube 135 and a sixth switch tube 136 in the application scenario. A first end of the fifth switch tube 135 is connected to a first control signal SAP. A second end of the fifth switch tube 135 is connected to a power signal VBLH. A third end of the fifth switch tube 135, a second end of the first switch tube 131 and a second end of the third switch tube 133 are connected to each other to form a first reference signal end. A first end of the sixth switch tube 136 is connected to a second control signal SAN. A second end of the sixth switch tube 136 is connected to a ground signal GND. The third end of the sixth switch tube 136, a third end of the second switch tube 132 and a third end of the fourth switch tube 134 are connected together to form a second reference signal end. The first switch tube 131, the third switch tube 133 and the fifth switch tube 135 are the P-type field effect transistors (FETs). First ends of the P-type FETs are grid pins, second ends of the P-type FETs are source pins, and third ends of the P-type FETs are drain pins. The second switch tube 132, the fourth switch tube 134 and the sixth switch tube 136 are N-type FETs. First ends of the N-type FETs are grid pins, second ends of the N-type FETs are drain pins, and third ends of the N-type FETs are source pins.

In addition, there may also be a pre-charging circuit provided between the first signal line 11 and the second signal line 12, and there may also be a pre-charging circuit provided between the second end of the third switch tube 133 and the third end of the fourth switch tube 134 to pre-charge the first reference signal end and the second reference signal end.

At present, the sensitive amplifier 10 is low in signal amplification speed, is easy to produce noise in the circuit and is high in power consumption, which affects the performance of the semiconductor memory.

The embodiments of the disclosure provide a control amplification circuit, which may include: a power consumption control circuit, an isolating circuit, and an amplification circuit. The power consumption control circuit is configured to receive a power consumption control signal and output a first reference signal according to the power consumption control signal. The isolating circuit is configured to determine a control instruction signal and generate an isolation control signal according to the control instruction signal. The amplification circuit is configured to receive the first reference signal, the isolation control signal and a signal to be processed, and process the signal to be processed based on the first reference signal and the isolation control signal to obtain a target amplified signal. In this way, by means of the control amplification circuit, the first reference signal can be adjusted according to a power consumption control signal, thus reducing the power consumption of the circuit.

The embodiments of the disclosure are elaborated below in combination with the accompanying drawings.

Figure 2:
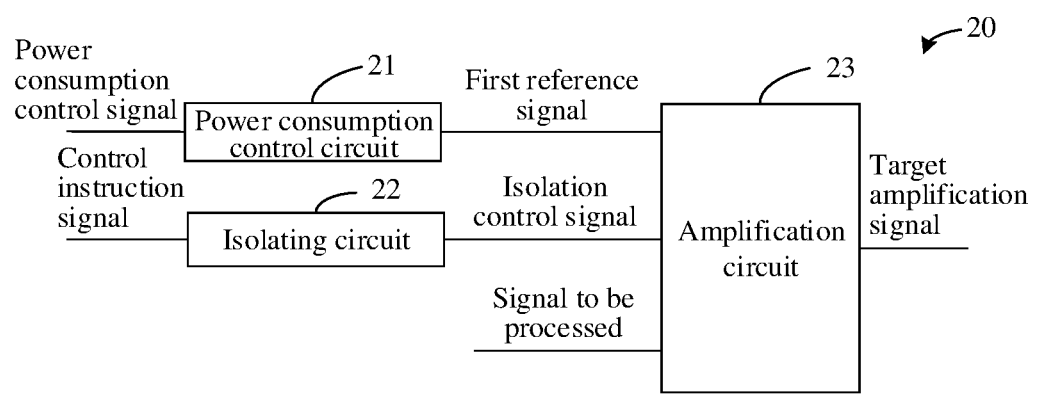
FIG. 2 illustrates a compositional structural diagram of a control amplification circuit provided in embodiments of the disclosure.

In an embodiment of the disclosure, FIG. 2 illustrates a compositional structural diagram of a control amplification circuit 20 provided in embodiments of the disclosure. As illustrated in FIG. 2, the control amplification circuit 20 may include: a power consumption control circuit 21, an isolating circuit 22, and an amplification circuit 23.

The power consumption control circuit 21 is configured to receive a power consumption control signal and output a first reference signal according to the power consumption control signal.

The isolating circuit 22 is configured to determine a control instruction signal and generate an isolation control signal according to the control instruction signal.

The amplification circuit 23 is configured to receive the first reference signal, the isolation control signal and a signal to be processed, and process the signal to be processed based on the first reference signal and the isolation control signal to obtain a target amplified signal.

It is to be noted that the control amplification circuit 20 provided in embodiments of the disclosure may be applied in a variety of scenarios of signal amplification, such as a sensitive amplifier in a DRAM.

The control amplification circuit 20 provided in embodiments of the disclosure receives a power consumption control signal, a control instruction signal and a signal to be processed from the outside, and completes a process of amplifying the signal to be processed based on the power consumption control signal and the control instruction signal, to finally obtain a target amplified signal. Here, both the power consumption control signal and the control instruction signal need to be determined according to the specific working stage of the amplification circuit.

Specifically, for the control amplification circuit 20, the first reference signal is output through the power consumption control circuit 21 according to the power consumption control signal; the isolation control signal is output through the isolating circuit 22 according to the control instruction signal and an isolation power value; and the signal to be processed is amplified through the amplification circuit 23 according to the first reference signal and the isolation control signal, and the target amplified signal is output.

In this way, because the power consumption control circuit is provided in the control amplification circuit, the specific voltage value of the first reference signal can be adjusted according to the power consumption control signal, so that the signal amplification process can be optimized, and the power consumption of the circuit can be reduced.

Figure 3:
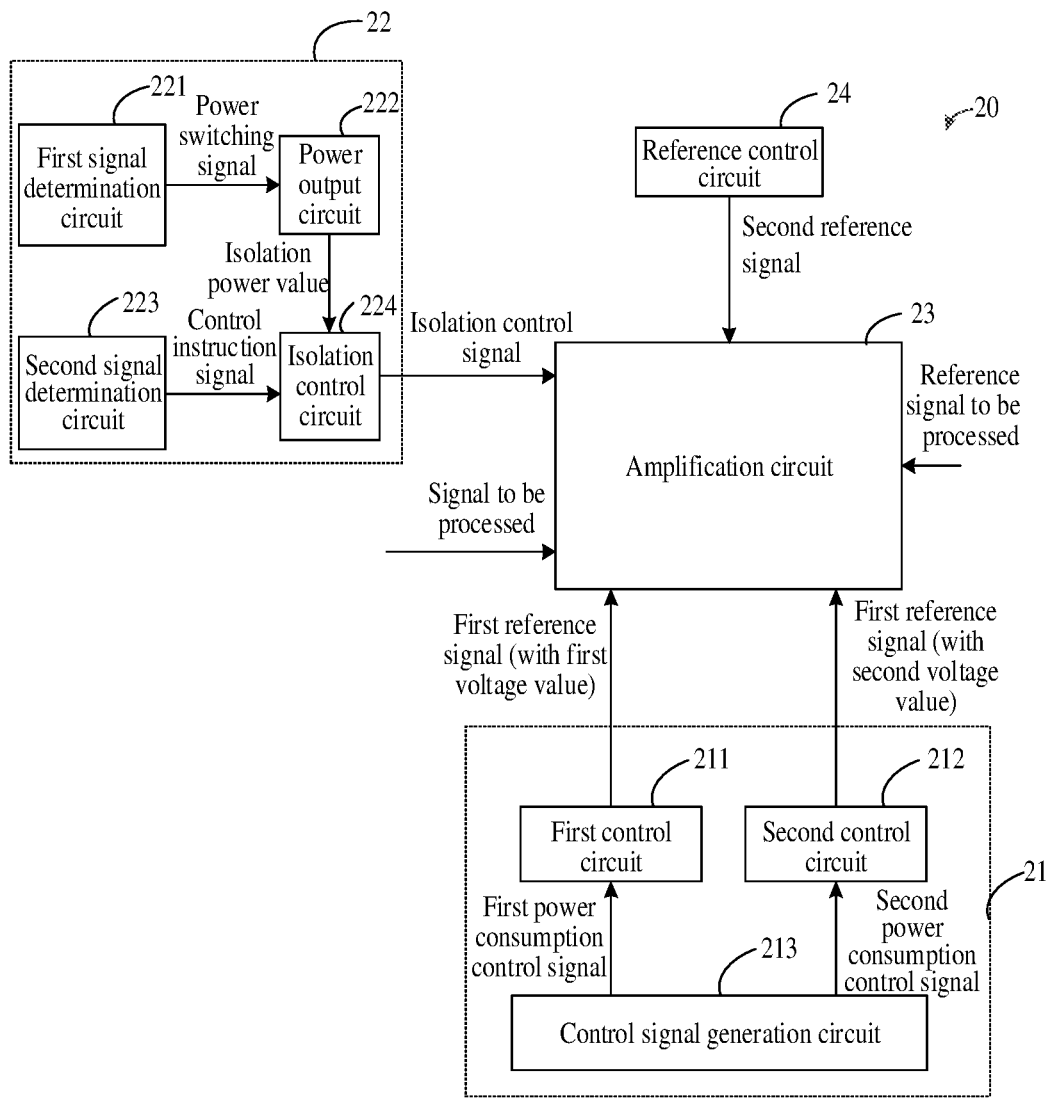
FIG. 3 illustrates a compositional structural diagram of another control amplification circuit provided in embodiments of the disclosure.

In some embodiments, based on FIG. 2, as illustrated in FIG. 3, the power consumption control circuit 21 includes a first control circuit 211 and a second control circuit 212, and the power consumption control signal includes a first power consumption control signal and a second power consumption control signal.

The first control circuit 211 is configured to receive the first power consumption control signal and output a first reference signal with a first voltage value in response to that the first power consumption control signal is in a first level state.

The second control circuit 212 is configured to receive the second power consumption control signal and output the first reference signal with a second voltage value in response to that the second power consumption control signal is in the first level state.

Here, the first voltage value is higher than the second voltage value.

It is to be noted that the first level state is relative to the second level state, and a specific voltage range of the first level state (or the second level state) needs to be determined for a specific electronic device. Exemplarily, for a P-type FET, the first level state can enable the P-type FET to be conducted, and the second level state can enable the P-type FET to be in an off state. For an N-type FET, the first level state can enable the N-type FET to be in an off state, and the second level state can enable the N-type FET to be conducted. Here, because different switch tubes have different specifications, the first level states of different switch tubes may correspond to different voltage ranges. For ease of understanding, in a conventional representation method, the first level state may be represented by logical "1" and the second level state may be represented by logical "0".

It is to be understood that the first reference signal may have at least a first voltage value or a second voltage value, and may have more voltage values.

In this way, when the first control circuit is conducted, the voltage value of the first reference signal is the first voltage value, and when the second control circuit is conducted, the voltage value of the first reference signal is the second voltage value, which can provide more control means for the control circuit, optimize the signal amplification process and reduce the power consumption of the circuit.

Figure 4A:
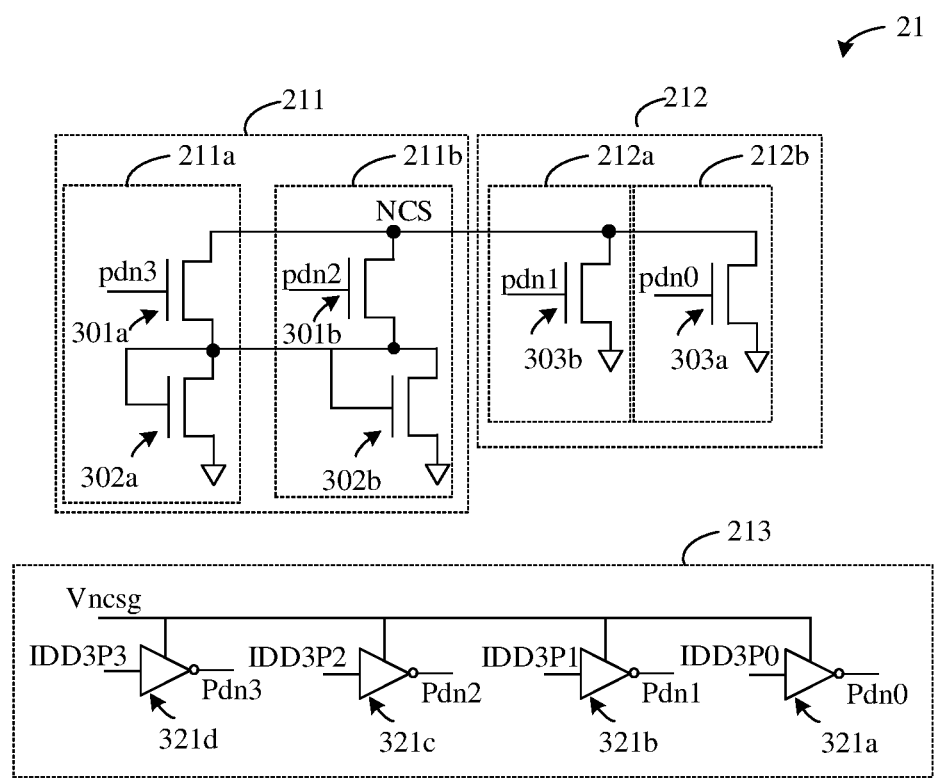
FIG. 4A illustrates a structural diagram of a power consumption control circuit provided in embodiments of the disclosure.

In some embodiments, based on FIG. 3, as illustrated in FIG. 4A which is a structural schematic diagram of a power consumption control circuit 21 provided in embodiments of the disclosure. As illustrated in FIG. 4A, the first control circuit 211 includes multiple first control sub-circuits (such as the first control circuit 211a and the first control sub-circuit 211b), and each of the first control sub-circuits includes a first switch tube (e.g., a first switch tube 301a and a first switch tube 301b) and a second switch tube 302 (e.g., a second switch tube 302a and a second switch tube 302b).

A first end of the first switch tube is configured to receive a first power consumption control signal (such as the first power consumption control signal pdn3 and the first power consumption control signal pdn2). A third end of the first switch tube is connected to a first end of the second switch tube and a second end of the second switch tube. A third end of the second switch tube is connected to a ground signal. Second ends of second switch tubes in the multiple first control sub-circuits are connected to each other, for example, the second ends of the second switch tube 302a and the second switch tube 302b are connected to each other.

The second end of the first switch tube is configured to output the first reference signal NCS.

It is to be noted that FIG. 4A illustrates two first control sub-circuits, but there can be more or less first control sub-circuits in practical application scenarios. In addition, there are also multiple first power consumption control signals, and each first power consumption control signal is input into a respective first control sub-circuit. Here, the level states of different first power consumption control signals may be the same or different. In other words, each first control sub-circuit is controlled by a respective first power consumption control signal separately.

As illustrated in FIG. 4A, both the first switch tube and the second switch tube are the N-type FETs. In the following description, the first end of the N-type FET is a grid pin, the second end of the N-type FET is a source pin, and the third end of the N-type FET is a drain pin.

Exemplarily, when both the first power consumption control signal pdn3 and the first power consumption control signal pdn2 are in the first level state, both the first switch tube 301a and the second switch tube 302a are conducted, and the potential of the first reference signal is pulled down to the first voltage value Vt. Vt refers to a threshold voltage of the second switch tube 302a and the second switch tube 302b. Here, if the threshold voltages of the second switch tube 302a and the second switch tube 302b are different from each other, Vt refers to the higher one of a grid turn-on voltage of the second switch tube 302a and the threshold voltage of the second switch tube 302b.

By providing the second switch tube, the current flowing through the first switch tube is reduced, while the special connection of the second switch tube makes the current flowing through the second switch tube to be very low, makes the power consumption very low, and can provide the stable first voltage value Vt for the NCS end.

In addition, by controlling the number of the first switch tubes that are conducted, a pull-down speed of voltage can be controlled, and the noise generated when the signal level is reduced during signal amplification can be further reduced.

Figure 4B:
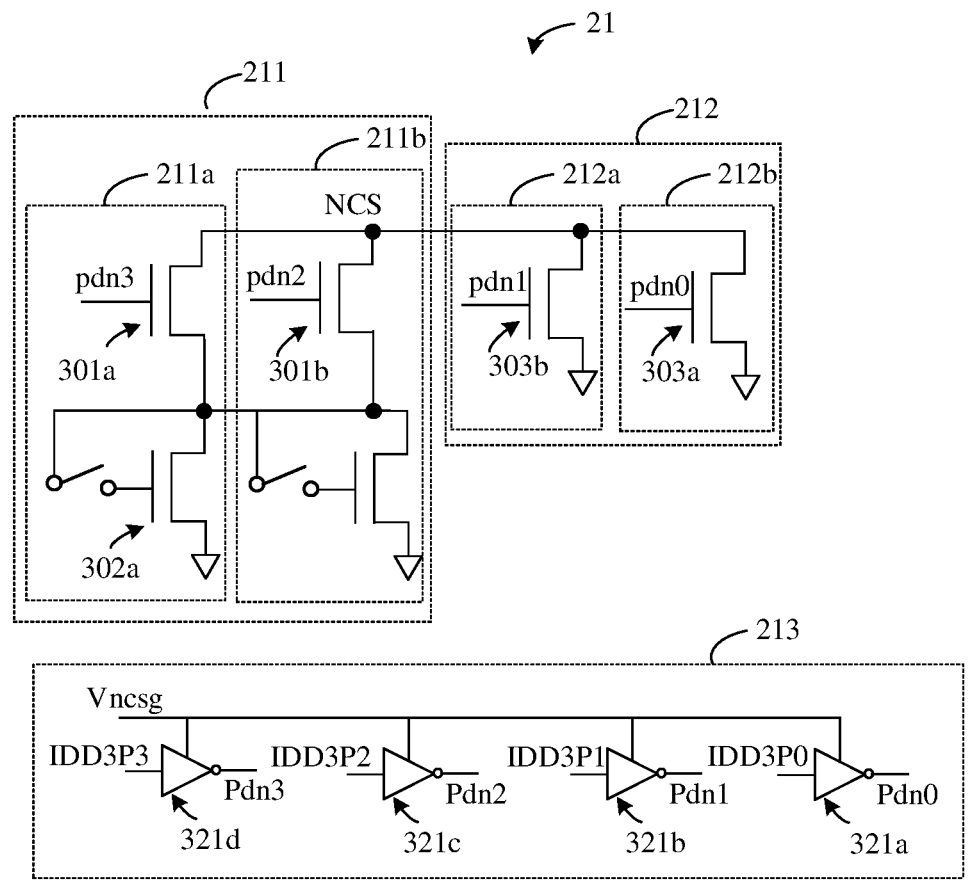
FIG. 4B illustrates a structural diagram of another power consumption control circuit provided in embodiments of the disclosure.

In some embodiments, as illustrated in FIG. 4B which is a structural schematic diagram of another power consumption control circuit 21 provided in embodiments of the disclosure. As illustrated in FIG. 4B, a switch is provided between the third end of the first switch tube and the first end of the second switch tube, and a control end of the switch is connected to a power saving control signal. In response to that the first power consumption control signal is in the first level state, the switch is controlled to be in a closed state by the power saving control signal.

In this way, by providing the switch in the first control sub-circuit and introducing the power saving control signal to perform control, the working state of the second switch tube can be better controlled.

In some embodiments, as illustrated in FIG. 4A or FIG. 4B, the second control circuit 212 includes multiple second control sub-circuits (e.g., a second control sub-circuit 212a and a second control sub-circuit 212b), and each of the second control sub-circuits includes a third switch tube (e.g., a third switch tube 303a and a third switch tube 303b).

A first end of the third switch tube is configured to receive the second power consumption control signals (e.g., the second power consumption control signal pdn0 and e.g., the second power consumption control signal pdn1), a third end of the third switch tube is connected to the ground signal, and a second end of the third switch tube is configured to output the first reference signal NCS.

Figure 5:
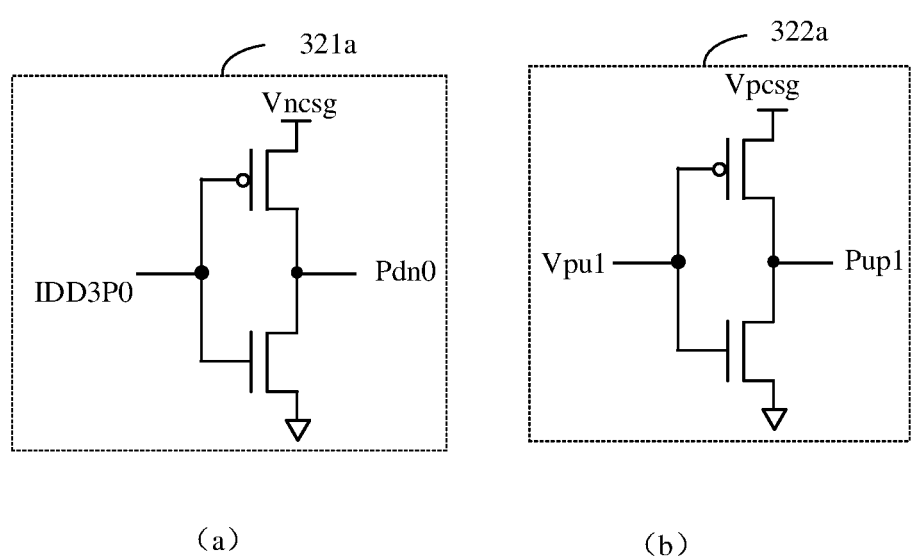
FIG. 5 illustrates a structural diagram of an inverter provided in embodiments of the disclosure.

It is to be noted that FIG. 4A and FIG. 4B respectively show two second control sub-circuits, but there can be more or less second control sub-circuits in practical application scenarios. In addition, there are also multiple second power consumption control signals, and each second power consumption control signal is input into a respective second control sub-circuit. Here, the level states of different second power consumption control signals may be the same or different. In other words, each second control sub-circuit is controlled by a respective second power consumption control signal separately. As illustrated in FIG. 5, all the third switch tubes are the N-type FETs.

Exemplarily, when both the second power consumption control signal pdn1 and the second power consumption control signal pdn0 are in the first level state, both the third switch tube 303a and the third switch tube 303b are conducted, and the potential of the first reference signal is pulled down to the second voltage value Vss. Because the third end of the third switch tube is connected to the ground potential, the second voltage value Vss may also be called the ground potential.

In addition, by controlling the number of the third switch tubes that are conducted, the pull-down speed of voltage may be controlled, and the noise generated when the signal level is reduced during signal amplification can be further reduced.

In some embodiments, as illustrated in FIG. 4A or FIG. 4B, the power consumption control circuit 21 may further include a control signal generation circuit 213.

The control signal generation circuit includes multiple first inverters (e.g., a first inverter 321a, a first inverter 321b, a first inverter 321c and a first inverter 321d), and each of the first inverters is configured to receive a respective initial control signal (e.g., an initial control signal IDD3P0, an initial control signal IDD3P1, an initial control signal IDD3P2 and an initial control signal IDD3P3) and generate a respective power consumption control signal ((e.g., a first power consumption control signal pdn3, a first power consumption control signal pdn2, a first power consumption control signal pdn1 and a first power consumption control signal pdn0).

That is, among these first inverters, each first inverter is configured to output a respective first power consumption control signal, or a respective second power consumption control signal. Correspondingly, among the multiple first inverters, the first power consumption control signal of each of the first control sub-circuits is output through a respective one of the multiple first inverters, and the second power consumption control signal of each of the second control sub-circuits is output through a respective one of the multiple first inverters.

It is to be noted that FIG. 4A shows four first inverters, but there can be more or less first inverters in practical application scenarios. In addition, there are also multiple initial control signals, and each initial control signal is input into a respective first inverter. Here, the level states of different initial control signals may be different from each other. In other words, each first inverter is controlled by a respective initial control signal separately.

Exemplarily, when both the initial control signal IDD3P0 and the initial control signal IDD3P1 are in the second level state, the first inverter 321a outputs the second power consumption control signal pdn0 in the first level state, and the first inverter 321b outputs the second power consumption control signal pdn1 in the first level state, so that the third switch tube 303a and the third switch tube 303b are conducted, and the first reference signal is pulled down to the second voltage value Vss.

On the contrary, when both the initial control signal IDD3P0 and the initial control signal IDD3P1 are in the first level state, and both the initial control signal IDD3P2 and the initial control signal IDD3P3 are in the second level state, the first inverter 321a outputs the second power consumption control signal pdn0 in the second level state, the first inverter 321b outputs the first power consumption control signal pdn1 in the second level state, the first inverter 321c outputs the first power consumption control signal pdn2 in the first level state, and the first inverter 321d outputs the second power consumption control signal pdn3 in the first level state, so that the first switch tube 301a and the first switch tube 301b are conducted and the third switch tube 303a and the third switch tube 303b are turned off, and the first reference signal is pulled down to the first voltage value Vt. In this case, a source-drain voltage difference of the first switch tube 301a becomes smaller, and the current flowing through the first switch tube 301a also becomes smaller. The power of the first switch tube 301a decreases relative to the third switch tube 303a, and the power of the first switch tube 301b also decreases relative to the third switch tube 303b.

It is to be noted that as illustrated in FIG. 4A or FIG. 4B, the input ends of the first inverters are also connected to the power signal Vncsg. When the initial control signal is in the second level state, the first inverter outputs the power consumption control signal in the first level state according to the power signal Vncsg. When the initial control signal is in the first level state, the first inverter outputs the power consumption control signal in the second level state. FIG. 5 illustrates a structural diagram of an inverter provided in embodiments of the disclosure. As illustrated in FIG. 5(a), the first inverter 321a may be realized by an N-type FET and a P-type FET.

In this way, by means of the first control circuit and the second control circuit, the first reference signal may be controlled to be pulled down to the first voltage value or the second voltage value, so as to subsequently optimize the signal processing process and reduce the power consumption of the circuit.

In some embodiments, as illustrated in FIG. 3, the control amplification circuit 20 may also include a reference control circuit 24.

The reference control circuit 24 is configured to determine a reference control signal and output a second reference signal according to the reference control signal.

The amplification circuit 23 is further configured to receive the first reference signal, the second reference signal, the isolation control signal and the signal to be processed, and process the signal to be processed based on the first reference signal, the second reference signal and the isolation control signal to obtain the target amplified signal.

It is to be noted that the first reference signal may provide a low reference potential for the amplification circuit 23, and the second reference signal may provide a high reference potential for the amplification circuit 23, so that the amplification circuit 23 may amplify the signal to be processed according to the high reference potential and the low reference potential.

It is to be understood that when the first reference signal is a low reference potential, its specific voltage value may be the first voltage value Vt or the second voltage value Vss. Because the first voltage value Vt is higher than the second voltage value Vss, the source-drain voltage difference of the first switch tube 301a decreases, and the current flowing through the first switch tube 301a also decreases relative to the current flowing through the third switch tube 303a, so that the working current of the first control circuit decreases while the amplification circuit 23 is maintained at the low reference potential. Thus, part of power consumption of the amplification circuit 23 can saved during signal amplification.

Figure 6A:
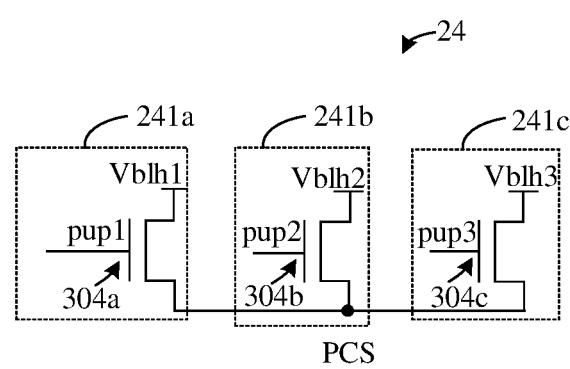
FIG. 6A illustrates a structural diagram of a reference control circuit provided in embodiments of the disclosure.

In a specific embodiment, based on FIG. 3, FIG. 6A illustrates a structural schematic diagram of a reference control circuit 24 provided in embodiments of the disclosure. As illustrated in FIG. 6A, the reference control circuit 24 includes multiple third control sub-circuits (e.g., a third control circuit 241a, a third control sub-circuit 241b, and a third control sub-circuit 241c), and each of the third control sub-circuits includes a respective fourth switch tube (e.g., a fourth switch tube 304a, a fourth switch tube 304b, and a fourth switch tube 304c).

A first end of the respective fourth switch tube is connected to a respective reference control signals (e.g., a reference control signal pup1, a reference control signal pup2, and a reference control signal pup3), a second end of the respective fourth switch tube is connected to a respective first preset power supplies (e.g., a first preset power supply Vblh1, a first preset power supply Vblh2, and a first preset power supply Vblh3), and a third end of the respective fourth switch tube is configured to output the second reference signal PCS.

It is to be noted that FIG. 6A illustrates three third control sub-circuits, but there can be more or less fourth switch tubes in practical application scenarios. In addition, there are also multiple reference control signals, and each reference control signal corresponds to a respective third control sub-circuit. The level states of the multiple reference control signals may be different, that is, the level states of the reference control signal pup1, the reference control signal pup2, and the reference control signal pup3 change separately. That is, each third control sub-circuit is controlled by a respective reference control signal separately.

As illustrated in FIG. 6A, the fourth switch tubes may be N-type FETs. Therefore, taking the fourth switch tube 304a as an example, the fourth switch tube 304a is turned off when the reference control signal pup1 is in the second level state; the fourth switch tube 304a is conducted when the reference control signal pup1 is in the first level state. The fourth switch tube 304a that is conducted charges the second reference signal PCS according to the first preset power supply Vblh1, so as to provide the high reference potential for the amplification circuit 23.

It is to be noted that each fourth switch tube is connected to a separate third preset power supply respectively, and the voltage values of these third preset power supplies may be different from each other to provide the second reference signal PCS with different rise speeds of voltage. In addition, the rise speed of voltage may also be controlled by controlling the number of the fourth switch tubes that are in a conducted state. In this way, the noise caused by rise of a signal level during signal amplification can be reduced by controlling the rise speed of voltage.

Figure 6B:
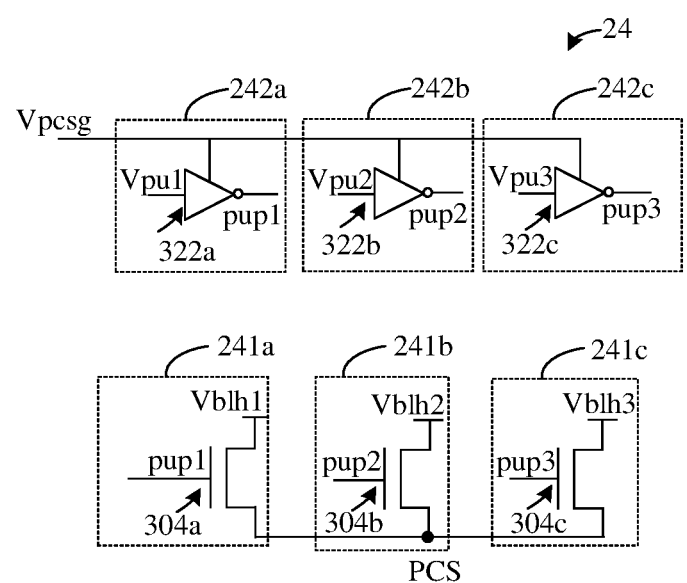
FIG. 6B illustrates a structural diagram of another reference control circuit provided in embodiments of the disclosure.

In another specific embodiment, based on FIG. 3, FIG. 6B illustrates a structural schematic diagram of another reference control circuit 24 provided in embodiments of the disclosure. As illustrated in FIG. 6B, the reference control circuit 24 includes multiple signal processing sub-circuits (e.g., a signal processing sub-circuit 242a, a signal processing sub-circuit 242b and a signal processing sub-circuit 242c) and multiple third control sub-circuits (e.g., a third control sub-circuit 241a, a third control sub-circuit 241b and a third control sub-circuit 241c).

Each of the multiple signal processing sub-circuit includes a respective second inverter (e.g., a second inverter 322a, a second inverter 322b, and a second inverter 322c), and the respective second inverter is configured to receive a respective initial reference signal (e.g., an initial reference signal Vpu1, an initial reference signal Vpu2, and an initial reference signal Vpu3), and generate a respective reference control signal (e.g., a reference control signal pup1, a reference control signal pup2, and a reference control signal pup3).

Each of the multiple third control sub-circuits includes a respective fourth switch tubes (e.g., a fourth switch tube 304a, a fourth switch tube 304b, and a fourth switch tube 304c). A first end of the respective fourth switch tube is connected to a respective reference control signal, a second end of the respective fourth switch tube is connected to a respective first preset power supplies (e.g., a first preset power supply Vblh1, a first preset power supply Vblh2, and a first preset power supply Vblh3), and the third end of the respective fourth switch tube is configured to output the second reference signal PCS.

Here, the multiple signal processing sub-circuits and the multiple third control sub-circuits are in one-to-one correspondence.

That is, a reference control signal is obtained from an initial control signal via a second inverter to match the control logic in different application scenarios. In other words, each initial reference signal is input into a respective second inverter, so that the second inverter outputs a respective reference control signal which is separately input into a respective fourth switch tube.

Taking the fourth switch tube 304a as an example, when the initial control signal Vpu1 is in the first level state, the reference control signal pup1 is in the second level state, and the fourth switch tube 304a is turned off. When the initial control signal Vpu1 is in the second level state, the reference control signal pup1 is in the first level state, and the fourth switch tube 304a is conducted. In this way, the fourth switch tube that is conducted will charge the second reference signal PCS according to the first preset power supply Vblh1, so as to provide the high reference potential for the amplification circuit 23.

The first reference signal and the second reference signal are also connected with a fourth preset power supply, which can maintain the first reference signal and the second reference signal at the reference voltage value when the power consumption control signals and the reference control signals are all in the second level state. The first voltage value is lower than the reference voltage value, and the first voltage value is lower than half of the fourth voltage value, so as to ensure the accuracy of data reading.

It is to be noted that as illustrated in FIG. 6B, the input ends of the third inverters are also connected to the power signal Vpcsg. When the initial control signal is in the second level state, the second inverter outputs the reference control signal in the first level state according to the power signal. When the initial control signal is in the first level state, the second inverter outputs the reference control signal in the second level state. As illustrated in FIG. 5(b), the second inverter 322a may be realized by an N-type FET and a P-type FET.

In some embodiments, as shown in FIG. 3, the isolating circuit 22 includes a first signal determination circuit 221, a power output circuit 222, a second signal determination circuit 223 and an isolation control circuit 224.

The first signal determination circuit 221 is configured to output, in response to receiving a preset operation instruction, at least one of a first power switching signal or a second power switching signal according to the preset operation instruction.

The power output circuit 222 is configured to output an isolation power value according to the at least one of the first power switching signal or the second power switching signal.

The second signal determination circuit 223 is configured to output, in response to receiving the preset operation instruction, the control instruction signal according to the preset operation instruction.

The isolation control circuit 224 is configured to receive the isolation power value and the control instruction signal, and generate the isolation control signal.

It is to be noted that, taking the DRAM as an example, the preset operation instruction may be a read instruction, a write instruction, or a refresh instruction.

It is to be noted that the isolation control signal is generated according to the isolation power value and the preset operation instruction, and the voltage of the isolation power value may be determined according to the first power switching signal and/or the second power switching signal. The first power switching signal and/or the second power switching signal is represented as the power switching signal in FIG. 3.

In this way, the power switching signal can be used to control the isolation power value, and the specific voltage value of the isolation power value can be adjusted by changing the power switching signal subsequently, so as to adjust the specific voltage value of the isolation control signal, optimize the signal amplification process, and alleviate the problems of low speed of signal amplification and being prone to produce noise to some extent.

Taking that the power switching signal includes both the first power switching signal and the second power switching signal as an example, a feasible structure of the power output circuit 222 is provided below.

In some embodiments, the power output circuit is configured to: determine the isolation power value to be a third voltage value in response to that the first power switching signal is in a second level state and the second power switching signal is in a first level state; or determine the isolation power value to be a fourth voltage value in response to that the first power switching signal is in the first level state and the second power switching signal is in the second level state.

Here, both the third voltage value and the fourth voltage value belong to the first level state, and the third voltage value is greater than the fourth voltage value.

In this way, the power output circuit 222 may output the isolation power value with two different voltage values, instead of a power signal with one fixed voltage value. In this way, in different working stages of the amplification circuit 23, more control means can be provided by adjusting the voltage value of the isolation power value, so as to alleviate the problems of low speed of signal amplification and large circuit noise to some extent.

In some embodiments, the isolation control circuit is specifically configured to: determine the isolation control signal to have the third voltage value in response to that the control instruction signal is at the first level state and the isolation power value has the third voltage value; or determine the isolation control signal to have the fourth voltage value in response to that the control instruction signal is at the first level state and the isolation power value is at the fourth voltage value; or determine the isolation control signal to have a fifth voltage value in response to that the control instruction signal is at the second level state.

The fifth voltage value belongs to the second level state, and the fifth voltage value is less than the fourth voltage value.

It is to be noted that for the isolating circuit 22, when the control instruction signal is in the first level state, the isolation control signal is in the first level state, and the isolation control signal has the same voltage value as an isolation voltage value; and when the control instruction signal has the second level state, the control instruction signal is in the second level state, or the control instruction signal has the fifth voltage value.

Exemplarily, in a conventional representation method, both the third voltage value and the fourth voltage value may be represented as logical "1", and the fifth voltage value may be represented as logical "0". The above is only an illustrative description and does not have actually limiting content.

In this way, there are three different voltage values of the isolation control signal, which may provide more control means to optimize the signal amplification process and alleviate the problems of low speed of signal amplification and large circuit noise.

Figure 7:
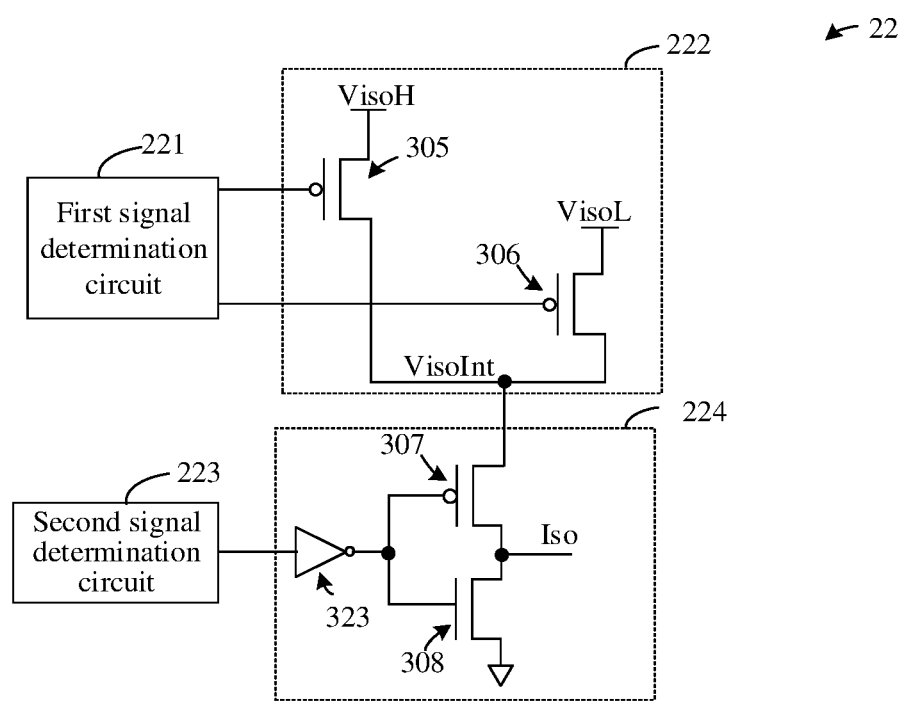
FIG. 7 illustrates a structural diagram of an isolating circuit provided in embodiments of the disclosure.

Based on FIG. 3, FIG. 7 illustrates a structural diagram of an isolating circuit 22 provided in embodiments of the disclosure. As illustrated in FIG. 7, the power output circuit 222 may include a second preset power supply VisoH, a third preset power supply VisoL, a fifth switch tube 305, and a sixth switch tube 306.

A first end of the fifth switch tube 305 is connected to the first power switching signal, and a first end of the sixth switch tube 306 is connected to the second power switching signal.

A second end of the fifth switch tube 305 is connected to the second preset power supply VisoH, and a second end of the sixth switch tube 306 is connected to the third preset power supply VisoL.

A third end of the fifth switch tube 305 is connected to a third end of the sixth switch tube 306, and is configured to output the isolation power value VisoInt.

Here, the second preset power supply VisoH is configured to output the third voltage value, and the third preset power supply VisoL is configured to output the fourth voltage value.

It is to be noted that, as illustrated in FIG. 7, both the fifth switch tube 305 and the sixth switch tube 306 are P-type FETs. In the following description, first ends of P-type FETs are grid pins, second ends of the P-type FETs are source pins, and third ends of the P-type FETs are drain pins.

It is to be noted that, when the first power switching signal is in the second level state and the second power switching signal is in the first level state, the fifth switch tube 305 is conducted and the sixth switch tube 306 is turned off, so the isolation power value VisoInt is equal to the voltage value of the second preset power supply VisoH, that is, the isolation power value VisoInt is the third voltage value. When the first power switching signal is in the first level state and the second power switching signal is in the second level state, the fifth switch tube 305 is turned off and the sixth switch tube 306 is conducted, so the isolation power value VisoInt is equal to the voltage value of the third preset power supply VisoL, that is, the isolation power value VisoInt is the fourth voltage value.

In some embodiments, as illustrated in FIG. 7, the isolation control circuit 224 may include a third inverter 323, a seventh switch tube 307 and an eighth switch tube 308.

An input end of the third inverter 323 is connected to an output end of the second signal determination circuit 223 to receive the control instruction signal output by the second signal determination circuit 223. An output end of the third inverter 323 is connected to a first end of the seventh switch tube 307 and a first end of the eighth switch tube 308 respectively.

A second end of the seventh switch tube 307 is connected to the isolation power value VisoInt, and a third end of the eighth switch tube 308 is connected to the ground signal.

A third end of the seventh switch tube 307 is connected to a second end of the eighth switch tube 308, and is configured to output the isolation control signal Iso.

It is to be noted that the seventh switch tube 307 is a P-type FET, and the eighth switch tube 308 is an N-type FET.

In this way, when the control instruction signal is in the first level state, the seventh switch tube 307 is in conducted, and the eighth switch tube 308 is turned off, thus the voltage value of the isolation control signal Iso is the same as the voltage value VisoInt of the isolation power value, that is, the third voltage value or the fourth voltage value. When the control instruction signal is in the second level state, the seventh switch tube 307 is turned off, and the eighth switch tube 308 is conducted, thus the isolation control signal Iso has the fifth voltage value, which is equivalent to the ground potential.

In this way, in the embodiments of the disclosure, on the premise that the isolation control signal Iso is in the first level state, the isolation control signal Iso may also be controlled to be at a higher voltage (the third voltage value) or a lower voltage (the fourth voltage value), so as to adapt to voltage requirements and signal transmission speeds in different amplification stages, and to further optimize the signal amplification process, improve the signal amplification speed and reduce the circuit noise.

Taking the DRAM as an example, the amplification circuit 23 also needs to be connected to a bit line/complementary bit line. In the initial state, the potential of the bit line is the same as that of the complementary bit line. After the storage unit on the bit line is enabled, the storage unit shares charges with the bit line, so that the potential of the bit line increases or decreases to form the signal to be processed; at the same time, the storage unit on the complementary bit line is always closed, so that the potential of the complementary bit line remains constant to form the reference signal to be processed. Due to the increase and decrease of the potential of the bit line, the voltage difference between the bit line and the complementary bit line changes, so some of components in the amplification circuit 23 are turned on to amplify the signal to be processed and obtain the target amplified signal.

At the beginning of amplification of the amplification circuit 23, the isolation control signal Iso is set to the fourth voltage value, so that the voltage rise of the bit line or the complementary bit is slow and no large noise will be generated to affect stored data of adjacent storage units. Therefore, a sensing amplitude of the amplification circuit 23 can be increased, while an internal node of the amplification circuit 23 can quickly reach the low reference potential or the high reference potential. In the subsequent amplification stage, the isolation control signal Iso is set to the third voltage value, then the voltage flowing through the bit line or the complementary bit line increases. Because the voltage of the internal node of the amplification circuit 23 has changed, the bit line or the complementary bit line will be pulled up or down quickly to improve the signal amplification speed and suppress the noise during the potential rise of the bit line or the complementary bit line.

Subsequently, the amplification circuit 23 completes the signal amplification process. Details are given in following.

Figure 8:
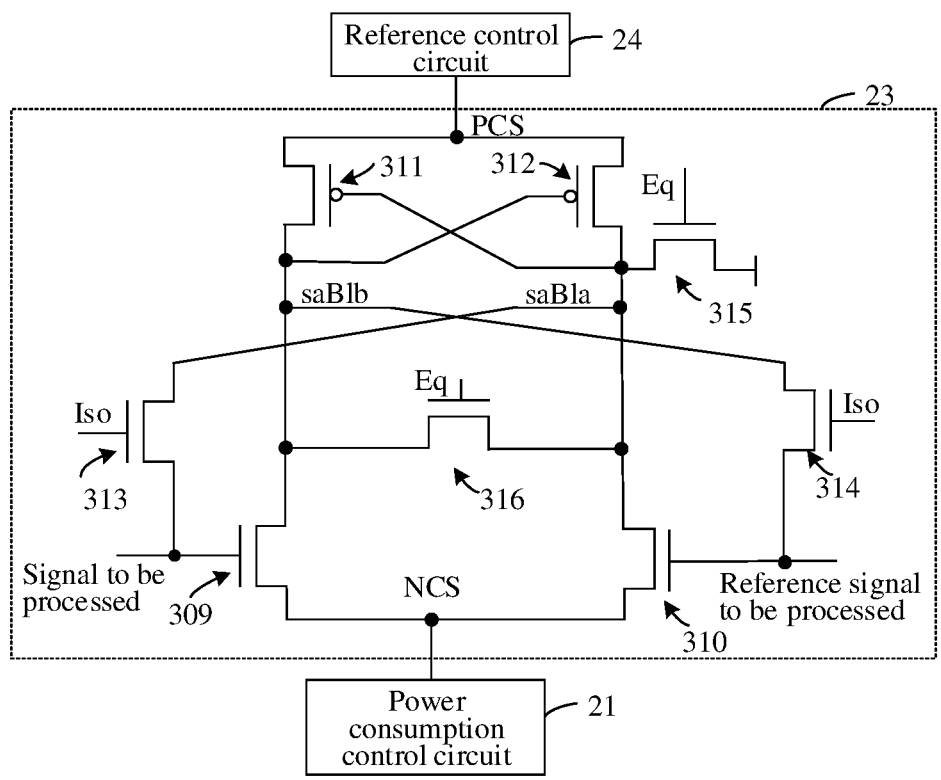
FIG. 8 illustrates a structural diagram of an amplification circuit provided in embodiments of the disclosure.

Based on this, in a specific embodiment, based on FIG. 3, FIG. 8 illustrates a structural schematic diagram of an amplification circuit 23 provided in embodiments of the disclosure. As illustrated in FIG. 8, the amplification circuit 23 may include a ninth switch tube 309, a tenth switch tube 310, an eleventh switch tube 311, a twelfth switch tube 312, a thirteenth switch tube 313 and a fourteenth switch tube 314.

A first end of the ninth switch tube 309 is connected to a third end of the thirteenth switch tube 313, and is configured to receive the signal to be processed. A second end of the ninth switch tube 309, a third end of the eleventh switch tube 311 and a first end of the twelfth switch tube 312 are connected to a second end of the fourteenth switch tube 314.

A first end of the tenth switch tube 310 is connected to a third end of the fourteenth switch tube 314, and is configured to receive the reference signal to be processed. A second end of the tenth switch tube 310, a third end of the twelfth switch tube 312 and a first end of the eleventh switch tube 311 are connected to a second end of the thirteenth switch tube 313.

A third end of the ninth switch tube 309 and a third end of the tenth switch tube 310 are connected to the first reference signal NCS. A second end of the eleventh switch tube 311 and a second end of the twelfth switch tube 312 are connected to the second reference signal PCS. A first end of the thirteenth switch tube 313 and a first end of the fourteenth switch tube 314 are connected to the isolation control signal Iso.

It is to be noted that, the ninth switch tube 309, the tenth switch tube 310, the thirteenth switch tube 313 and the fourteenth switch tube 314 are N-type FETs, and the eleventh switch tube 311 and the twelfth switch tube 312 are P-type FETs.

In this way, when the isolation control signal Iso is in the first level state (having the third voltage value or the fourth voltage value), the thirteenth switch tube 313 and the fourteenth switch tube 314 are conducted. When the isolation control signal Iso is in the second level state (having the fifth voltage value), the thirteenth switch tube 313 and the fourteenth switch tube 314 are turned off.

During signal amplification, the amplification circuit 23 will be in different working stages, and it is necessary to transmit the signal to be processed and the reference signal to be processed to the amplification circuit 23 through the isolation control signal Iso, so as to speed up the amplification process of the amplification circuit 23. Therefore, the isolation control signal Iso will affect the signal amplification process. The isolation control signal Iso provided in the embodiments of the disclosure has three voltage values. By adjusting the voltage value of the isolation control signal Iso to adapt to the amplification circuit at different working stages 23, the signal amplification process can be optimized, and the problems of low speed of signal amplification and large circuit noise can be alleviated.

In some embodiments, as illustrated in FIG. 8, the amplification circuit 23 further includes a pre-charging circuit, and the pre-charging circuit includes a fifteenth switch tube 315 and a sixteenth switch tube 316.

A first end of the fifteenth switch tube 315 and a first end of the sixteenth switch tube 316 are connected to a pre-charging signal Eq.

A second end of the fifteenth switch tube 315 is connected to a fourth preset power supply, and a third end of the fifteenth switch tube 315 is connected to the second end of the tenth switch tube 310.

A third end of the sixteenth switch tube 316 is connected to the second end of the ninth switch tube 309, and a second end of the sixteenth switch tube 316 is connected to the second end of the tenth switch tube 310.

Here, both the fifteenth switch tube 315 and the sixteenth switch tube 316 are N-type FETs.

In this way, the pre-charging circuit performs, in response to the pre-charging signal Eq, pre-charging for the amplification circuit 23 according to the fourth preset power supply, so that each circuit node of the amplification circuit 23 is at the same reference voltage value after the pre-charging ends.

Figure 9:
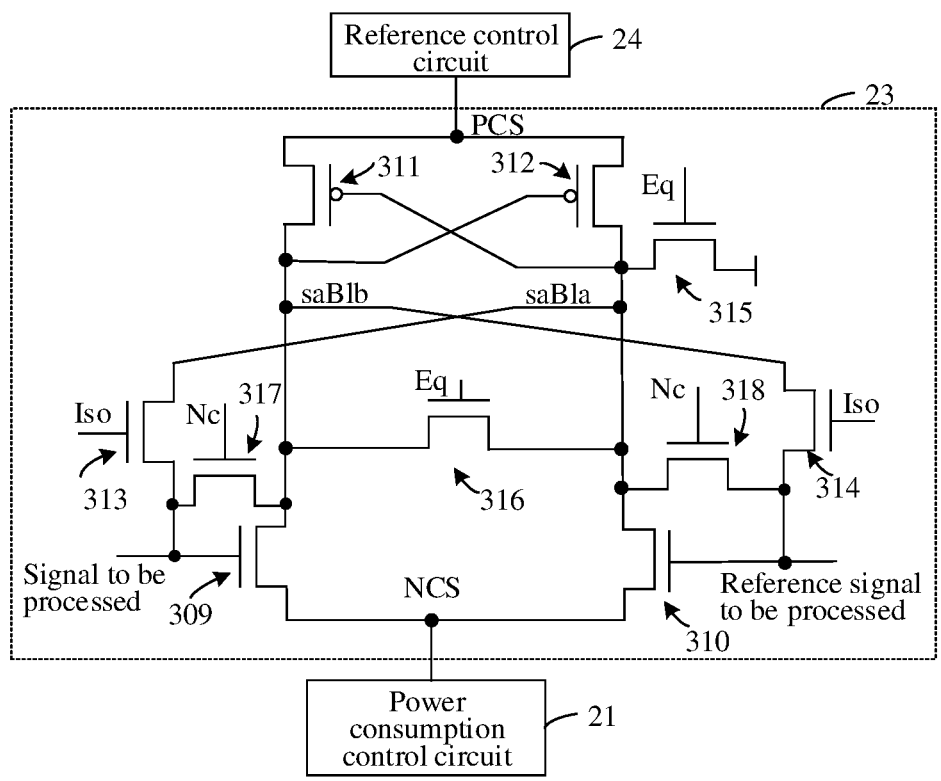
FIG. 9 illustrates a structural diagram of another amplification circuit provided in embodiments of the disclosure.

In some embodiments, based on FIG. 8, as illustrated in FIG. 9, the amplification circuit 23 further includes a noise canceling circuit, and the noise canceling circuit includes a seventeenth switch tube 317 and an eighteenth switch tube 318.

A first end of the seventeenth switch tube 317 and a first end of the eighteenth switch tube 318 are connected to a noise canceling signal Nc.

A second end of the seventeenth switch tube 317 is connected to the second end of the ninth switch tube 309, and a third end of the seventeenth switch tube 317 is connected to the first end of the ninth switch tube 309.

A second end of the eighteenth switch tube 318 is connected to the second end of the tenth switch tube 310, and a third end of the eighteenth switch tube 318 is connected to the first end of the tenth switch tube 310.

Here, both the seventeenth switch tube 317 and the eighteenth switch tube 318 are N-type FETs. Therefore, when the noise canceling signal is in the first level state, the seventeenth switch tube 317 and the eighteenth switch tube 318 are conducted, so that the first end and the third end of the ninth switch tube 309 are shorted, and the first end and the third end of the tenth switch tube 310 are shorted; moreover, the first reference signal NCS is controlled to be at the first voltage value Vt, and the second reference signal PCS is controlled to be at the high reference potential, so as to perform an offset cancellation operation on the ninth switch tube 309 and the tenth switch tube 310. In this way, a threshold difference of the switch tubes during signal amplification can be further eliminated, and the accuracy of sensing the signal to be processed during signal amplification can be improved.

In particular, FIG. 3 to FIG. 9 are merely illustrative structures of the control amplification circuit. The fifth switch tube 305, the sixth switch tube 306, the seventh switch tube 307, the eleventh switch tube 311 and the twelfth switch tube 312 are P-type FETs.

The first switch tube 301, the second switch tube 302, the third switch tube 303, the fourth switch tube 304, the eighth switch tube 308, the ninth switch tube 309, the tenth switch tube 310, the thirteenth switch tube 313, the fourteenth switch tube 314, the fifteenth switch tube 315, the sixteenth switch tube 316, the seventeenth switch tube 317 and the eighteenth switch tube 318 are N-type FETs.

First ends of the P-type FETs are grid ends, second ends of the P-type FETs are source e ends, and third ends of the P-type FETs are drain ends. First ends of the N-type FETs are grid ends, second ends of the N-type FETs are drain ends, and third ends of the N-type FETs are source ends.

Of course, the model selection of the above switch tubes does not form limitation to the embodiments of the disclosure. In practical application scenarios, the aforementioned circuit control logic may be realized through various types of circuit components, and the components may be selected according to the actual application scenarios.

The embodiments of the disclosure provide a control amplification circuit. In an aspect, by adding the power consumption control circuit, the first reference signal may have a higher voltage (the first voltage value Vt) or a lower voltage value (the second voltage value Vss) on the premise of being the low reference potential, and subsequently, the voltage value of the first reference signal may be adjusted according to the working stage of the amplification circuit to reduce the power consumption of the circuit. In another aspect, by adding the power switching circuit, the isolation power value with two voltage values is provided, so that the isolation control circuit can output the isolation control signal with three different voltage values (the third voltage value, the fourth voltage value or the fifth voltage value) according to the isolation power value. When the amplification circuit is not in an operating state, the voltage of the isolation power value may be decreased to the second voltage value to reduce the electric leakage phenomenon of the switch tube in the isolation control circuit, thereby avoiding the failure of the switch tube and prolonging the service life of the isolation control circuit. In a further aspect, the voltage value of the isolation control signal is adjusted to the third voltage value or the fourth voltage value in different working stages of the amplification circuit, so as to accelerate the change speed of voltage of the isolation control circuit, optimize the signal amplification process, and alleviate the problems of low speed of signal amplification and large circuit noise.

Figure 10:
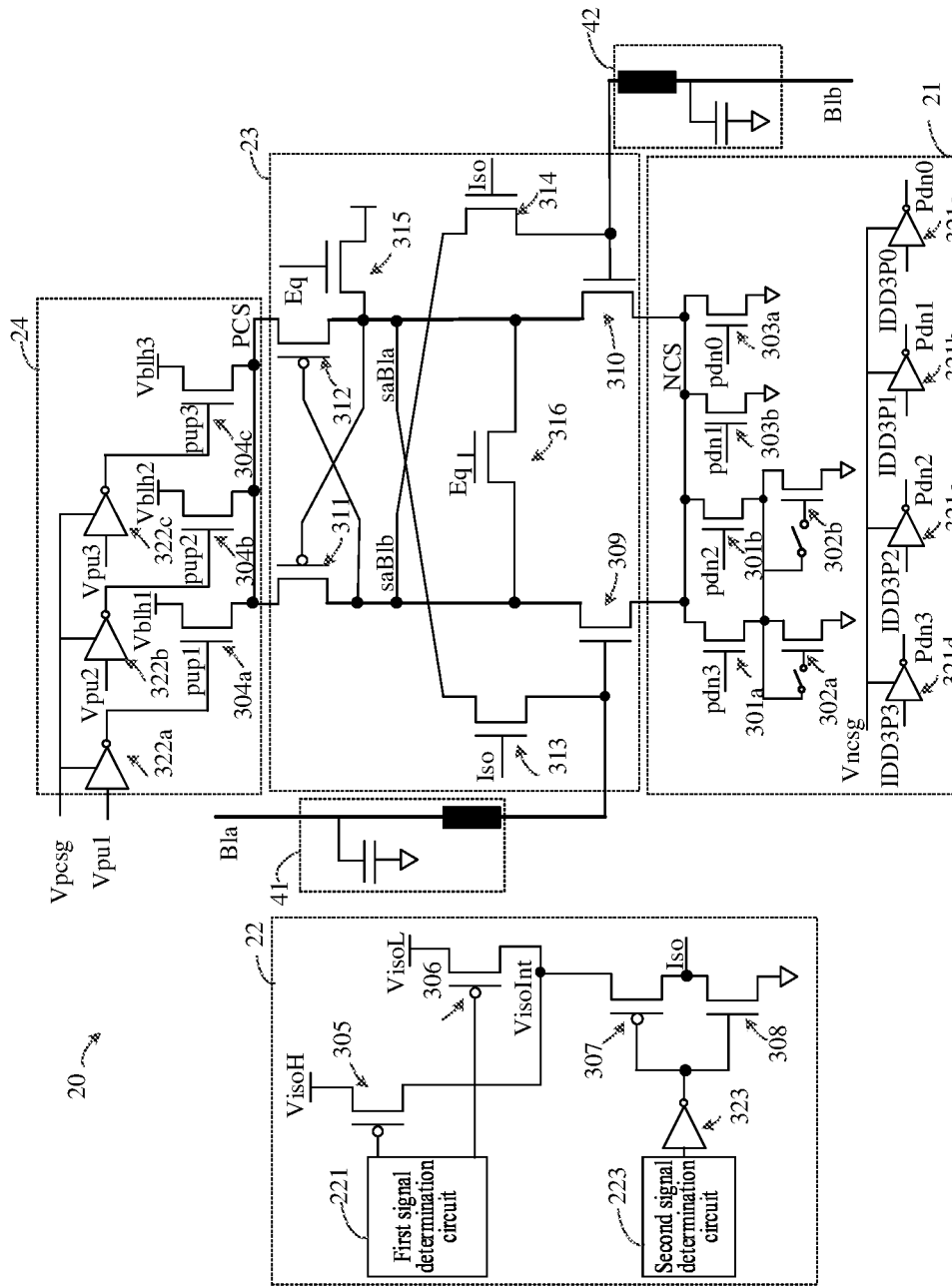
FIG. 10 illustrates a schematic diagram of an application scenario of a control amplification circuit provided in embodiments of the disclosure.

In another embodiment of the disclosure, FIG. 10 illustrates a schematic diagram of an application scenario of a control amplification circuit 20 provided in embodiments of the disclosure As illustrated in FIG. 10, there are a bit line Bla, a complementary bit line Blb, a readout bit line saBla, a complementary readout bit line saBlb and a control amplification circuit 20 in the application scenario. A first storage unit 41 is arranged on the bit line Bla, and a second storage unit 42 is arranged on the complementary bit line Blb.

The control amplification circuit 20 includes the power consumption control circuit 21, the isolating circuit 22, the amplification circuit 23 and the reference control circuit 24. The power consumption control circuit 21 includes multiple first switch tubes (such as the first switch tube 301 and the first switch tube 301b), multiple second switch tubes (such as the second switch tube 302a and the second switch tube 302b), multiple switches, multiple third switch tubes (such as the third switch tube 303a and the third switch tube 303b), multiple first inverters (such as the first inverter 321a, the first inverter 321b, the first inverter 321c and the first inverter 321d). The reference control circuit 24 includes multiple fourth switch tubes (such as the fourth switch tube 304a, the fourth switch tube 304b and the fourth switch tube 304c) and multiple second inverters (such as the second inverter 322a, the second inverter 322b and the second inverter 322c). The isolating circuit 22 includes the first signal determination circuit 221, the second signal determination circuit 223, the second preset power supply VisoH, the third preset power supply VisoL, the fifth switch tube 305, the sixth switch tube 306, the seventh switch tube 307, the eighth switch tube 308 and the third inverter 323. The amplification circuit 23 includes the ninth switch tube 309, the tenth switch tube 310, the eleventh switch tube 311, the twelfth switch tube 312, the thirteenth switch tube 313, the fourteenth switch tube 314, the fifteenth switch tube 315 and the sixteenth switch tube 316.

The second end of the tenth switch tube 310, the third end of the twelfth switch tube 312, the first end of the eighteenth switch tube 311 and the second end of the thirteenth switch tube 313 are all connected to the readout bit line saBla, and the second end of the ninth switch tube 309, the third end of the eleventh switch tube 311, the first end of the twelfth switch tube 312 and the second end of the fourteenth switch tube 314 are all connected to the complementary readout bit line saBlb.

The third end of the thirteenth switch tube 313 and the first end of the ninth switch tube 309 are connected to the bit line Bla. The first end of the tenth switch tube 310 and the third end of the fourteenth switch tube 314 are connected to the complementary bit line Blb. The thirteenth switch tube 313 connects the bit line Bla with the readout bit line saBla in response to the isolation control signal Iso. The fourteenth switch tube 314 connects the complementary bit line Blb to the complementary readout bit line saBlb in response to the isolation control signal Iso.

The third end of the fifteenth switch tube 315 is connected to the complementary readout bit line saBlb, the third end of the sixteenth switch tube 316 is connected to the readout bit line saBla, and the second end of the sixteenth switch tube 316 is connected to the complementary readout bit line saBlb, so as to equalize, in response to the equalization signal Eq, the bit line Bla, the complementary bit line Blb, the readout bit line saBla and the complementary readout bit line saBlb to the reference voltage.

In the application scenario, the types and connection relations of the components are as illustrated in FIG. 9, and the meaning of symbols and the working principle of the circuit in FIG. 9 may refer to the content described above, which will not be described again.

Figure 11:
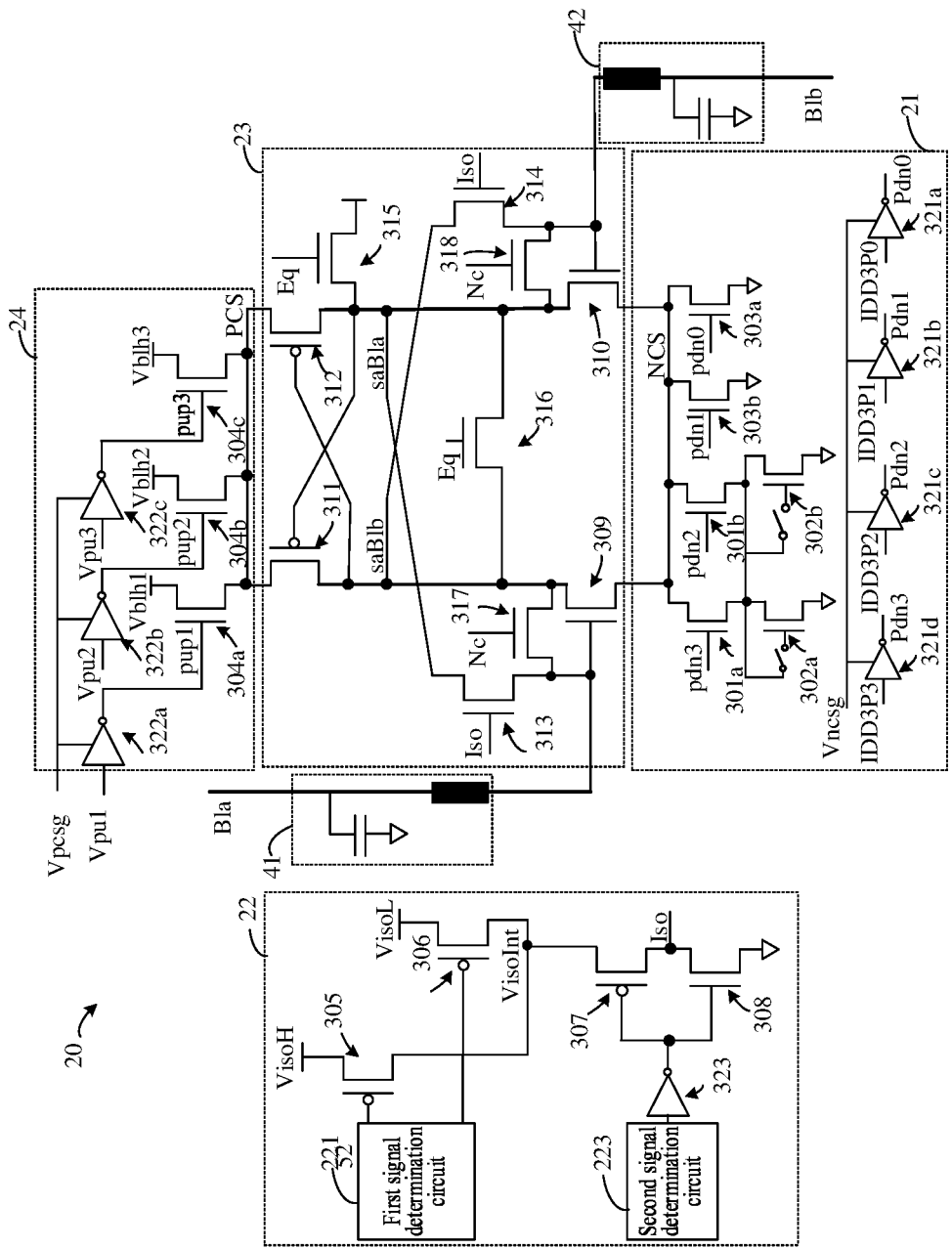
FIG. 11 illustrates a schematic diagram of another application scenario of a control amplification circuit provided in embodiments of the disclosure.

Based on FIG. 10, FIG. 11 illustrates a schematic diagram of another application scenario of a control amplification circuit provided in embodiments of the disclosure. As illustrated in FIG. 11, the amplification circuit further includes the seventeenth switch tube 317 and the eighteenth switch tube 318. The second end of the seventeenth switch tube 317 is connected to the complementary readout bit line saBlb, the third end of the seventeenth switch tube 317 is connected to the bit line Bla, the second end of the eighteenth switch tube 318 is connected to the readout bit line saBla, and the third end of the eighteenth switch tube 318 is connected to the complementary bit line Blb. In response to the noise canceling signal Nc, the offset cancellation operation is performed to the ninth switch tube 309 and the tenth switch tube 310 by controlling the first reference signal NCS to be at the first voltage value Vt, and the second reference signal PCS to be at the high reference potential.

In short, the power consumption control circuit 21 is configured to output the first reference signal NCS as the low reference potential to the amplification circuit 23, and the reference control circuit 24 is configured to output the second reference signal PCS as the high reference potential to the amplification circuit 23. The isolating circuit 22 is configured to output the isolation control signal Iso to the amplification circuit 23. The amplification circuit amplifies the signal to be processed according to the isolation control signal Iso, the first reference signal NCS and the second reference signal PCS to obtain the target amplified signal. In addition, the reference control circuit 24 also performs a pre-charging operation in response to the pre-charging signal, and performs the offset cancellation operation in response to the noise canceling signal.

Here, the first reference signal NCS as the low reference potential may have the first voltage value Vt or the second voltage value Vss. The isolation control signal in the first level state may be the fourth voltage value or the third voltage value, and the isolation control signal in the second level state may be the fifth voltage value.

It is to be understood that, during signal amplification, the amplification circuit 23 has different working stages, and the level states of the signals (such as the isolation control signal Iso/the pre-charging signal Eq/the noise canceling signal Nc/the first reference signal NCS/the second reference signal PCS) are different in the different working stages, so that the amplification circuit 23 performs different tasks.

Exemplarily, taking the control amplification circuit in FIG. 11 as an example, a process that the amplification circuit 23 processes the signal to be processed includes: a standby stage, a noise canceling stage, a first charge sharing stage, a second charge sharing stage, a signal amplifying stage, a signal writing back stage, a signal stabilizing stage and a pre-charging stage.

When the amplification circuit 23 is in one of the second charge sharing stage, the signal amplifying stage or the pre-charging stage, the isolation control signal is maintained to be at the third voltage value.

When the amplification circuit 23 is in the standby stage or the signal writing back stage, the isolation control signal is maintained to be at the fourth voltage value.

When the amplification circuit 23 is in the noise canceling stage or the first charge sharing stage, the isolation control signal is maintained to be at the fifth voltage value.

In some embodiments, when the amplification circuit 23 is in the signal writing-back stage, the first power consumption control signal is in the first level state, and the second power consumption control signal is in the second level state. When the amplification circuit 23 is in one of the standby stage, the noise canceling stage, the first charge sharing stage, the second charge sharing stage, the signal amplifying stage or the pre-charging stage, the first power consumption control signal is in the second level state.

In this way, on the one hand, by adjusting the isolation control signal to have different voltage values, the signal processing can be optimized, and the problems of low signal amplification speed and large circuit noise can be alleviated; on the other hand, by adjusting the first power consumption control signal and the second power consumption control signal, the voltage value of the first reference signal can be controlled, and the power consumption of the circuit can be reduced.

The working principle of the amplification circuit 23 in each working stage and the specific change of each signal are described below.

Figure 12:
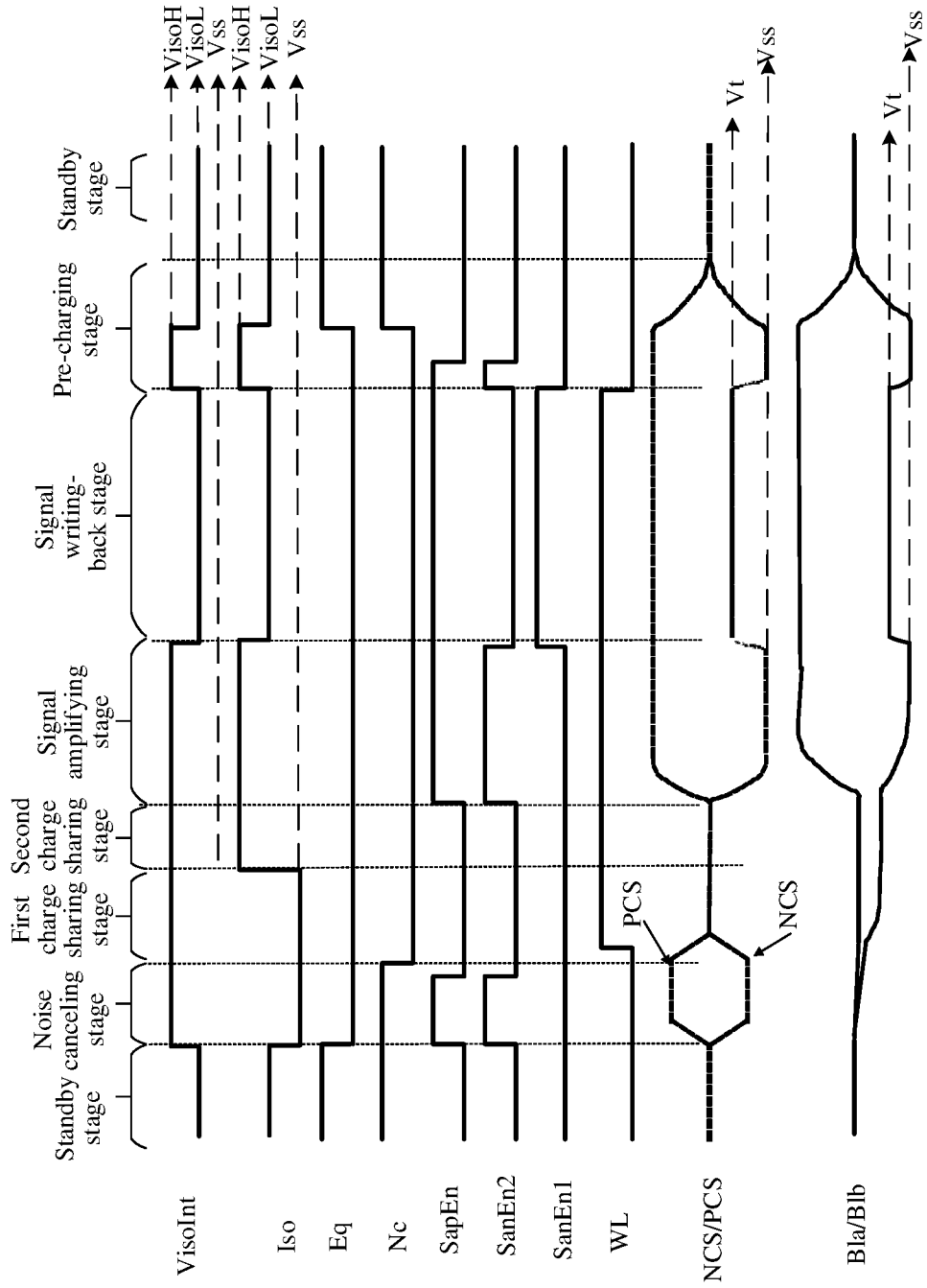
FIG. 12 illustrates a schematic diagram of signal sequence of an amplification circuit provided in embodiments of the disclosure.

Based on FIG. 11, FIG. 12 illustrates a schematic diagram of signal sequence of an amplification circuit provided in embodiments of the disclosure. In FIG. 12, VisoInt refers to the aforementioned isolation power value, which may be the third voltage value VisoH and the fourth voltage value VisoL. Iso refers to the aforementioned isolation control signal, which may be the fifth voltage value Vss, the third voltage value VisoH, and the fourth voltage value VisoL. Eq refers to the aforementioned pre-charging signal, and Nc refers to the aforementioned noise canceling signal. SanEn1 refers to the aforementioned first power consumption control signal, SanEn2 refers to the aforementioned second power consumption control signal, and SapEn refers to the aforementioned reference control signal. WL is an enabling signal of the storage unit. When the WL is in the first level state, the storage unit is connected to the bit line, and when the WL is in the second level state, the storage unit is not connected to the bit line. NCS/PCS refers to the first reference signal/ the second reference signal. The first reference signal has the reference voltage value, the first voltage value Vt or the second voltage value Vss, and both the first voltage value Vt and the second voltage value Vss may be called the low reference potential. The second reference signal has the reference voltage value or the high reference potential. Bla refers to the bit line, and Blb refers to the complementary bit line.

When the amplification circuit 23 is in the standby stage, the isolation power value VisoInt is maintained at the fourth voltage value VisoL, the isolation control signal Iso is maintained at the fourth voltage value VisoL, the pre-charging signal Eq and the noise canceling signal Nc are in the first level state, and the first power consumption control signal SanEn1, the second power consumption control signal SanEn2, the reference control signal SapEn and the word line enabling signal WL are all in the second level state. In this case, the thirteenth switch tube 313 to the eighteenth switch tube 318 are conducted, and the fourth preset power supply charges for the amplification circuit 23, so that the voltages of all nodes in the amplification circuit 23, the bit line Bla, the complementary bit line Blb, the readout bit line saBla, the complementary readout bit line saBlb, the first reference signal NCS and the second reference signal PCS are at the reference voltage value, and the reference voltage value is at the low reference potential and high reference potential respectively to prepare for subsequent execution of the preset operation instruction.

After receiving the preset operation instruction, the amplification circuit 23 enters the noise canceling stage. The isolation control signal Iso is adjusted to the fifth voltage value Vss, so that the thirteenth switch tube 313 and the fourteenth switch tube 314 are turned off. At the same time, the pre-charging signal Eq is adjusted to the second level state, and the fifteenth switch tube 315 and the sixteenth switch tube 316 are turned off. The noise canceling signal Nc is still in the first level state, so that the seventeenth switch tube 317 and the eighteenth switch tube 318 are conducted. The reference control signal SapEn and the second power consumption control signal SanEn2 are adjusted from the second level state to the first level state, and the third switch tube 303a and the fourth switch tube 304a are conducted. In this way, it is realized that the first reference signal NCS is at the second voltage value Vt, and the second reference signal PCS is at the high reference potential, so as to perform offset cancellation to the ninth switch tube 309 and the tenth switch tube 310 to cancel the threshold voltage difference between the ninth switch tube 309 and the tenth switch tube 310. In addition, in the noise canceling stage, the second power consumption control signal SanEn2 is still in the second level state. In particular, in this stage, the isolation power value VisoInt is adjusted in advance to the third voltage value, which can subsequently improve the rise speed of the voltage of the isolation control signal Iso, and improve the signal processing speed.

Explanation is given below with the preset operation instruction being a refresh instruction for the first storage unit 41 as an example.

After the noise canceling stage ends, the reference control signal SapEn and the second power consumption control signal SanEn2 are first adjusted to the second level state, and the first reference signal NCS and the second reference signal PCS are adjusted to the reference voltage values respectively. The amplification circuit 23 enters the first charge sharing stage, and the storage unit enabling signal WL is adjusted to the first level state to instruct to enable the first storage unit 41, so as to share charges with the bit line Bla and generating the signal to be processed. As illustrated in FIG. 12, in this stage, the signal to be processed is generated on the bit line Bla, and because the second storage unit 42 will not be enabled, the reference voltage value is still maintained on the complementary bit line Blb, which may be considered that the reference signal to be processed is on the complementary bit line Blb. In this process, the isolation control signal Iso is maintained at the fifth voltage value Vss, and the thirteenth switch tube 313 and the fourteenth switch tube 314 are turned off, so that the bit line Bla is not got through to the readout bit line saBla, and the complementary bit line Blb is not got through to the complementary readout bit line saBlb, so as to avoid affecting the charge sharing between the first storage unit 41 and the bit line Bla. In addition, the pre-charging signal Eq, the noise canceling signal Nc, the first power consumption control signal SanEn1, the second power consumption control signal SanEn2 and the reference control signal SapEn are still in the second level state, and both the first reference signal NCS and the second reference signal PCS are at the reference voltage value.

After the first charge sharing stage ends, the amplification circuit 23 enters the second charge sharing stage. The isolation control signal Iso is adjusted to the third voltage value VisoH, and the thirteenth switch tube 313 and the fourteenth switch tube 314 are conducted, so that the bit line Bla is got through to the readout bit line saBla, and the complementary bit line Blb is got through to the complementary readout bit line saBlb. Thus, the bit line Bla shares charges with the readout bit line saBla, and the complementary bit line Blb shares charges with the complementary readout bit line saBlb. The amplification circuit 23 receives the signal to be processed from the bit line Bla, and the amplification circuit 23 receives the reference signal to be processed from the complementary bit line Blb. In addition, the pre-charging signal Eq, the noise canceling signal Nc, the first power consumption control signal SanEn1, the second power consumption control signal SanEn2 and the reference control signal SapEn are still in the second level state, and both the first reference signal NCS and the second reference signal PCS are at the reference voltage value.

After the second charge sharing stage ends, the control amplification circuit 20 enters the signal amplifying stage. The second power consumption control signal SanEn2 and the reference control signal SapEn are adjusted to the first level state, thus the first reference signal NCS decreases from the reference voltage value to the second voltage value Vss (the low reference potential), and the second reference signal PCS increases from the reference voltage value to the high reference potential. The amplification circuit 23 amplifies the signal to be processed according to the first reference signal NCS and the second reference signal PCS, and increases or decreases the voltage value of the signal to be processed to obtain the target amplified signal. In addition, the isolation control signal Iso increases from the fourth voltage value VisoL to the third voltage value VisoH to improve a charge transfer speed. Both the pre-charging signal Eq and the noise canceling signal Nc are maintained in the second level state. As illustrated in FIG. 12, in the signal amplifying stage, a signal voltage difference between the bit line Bla and the complementary bit line Blb increases.

After the signal amplifying stage ends, the amplification circuit 23 enters the signal writing-back stage, and restores the stored data in the first storage unit 41 mainly through the voltage value of the bit line Bla after amplification to avoid data failure. At this point, the isolation power value VisoInt decreases from the third voltage value VisoH to the fourth voltage value VisoL, so that the isolation control signal Iso decreases from the third voltage value VisoH to the fourth voltage value VisoL. The first power consumption control signal SanEn1 is adjusted from the second level state to the first level state, and the second power consumption control signal SanEn2 is adjusted from the first level state to the second level state, that is, the amplification circuit 23 enters a power saving mode (or referred to as IDD3P mode). At this point, the first reference signal NCS is adjusted from the second voltage value Vss to the first voltage value Vt to reduce the power consumption of the circuit.

After the signal writing-back stage ends, the storage unit enabling signal WL is adjusted to the second level state to indicate the first storage unit 41 to be disabled.

The end time of the power saving mode may be earlier than the disabling time of the first storage unit 41, and occupies 80% of the signal writing-back stage. After the power saving mode ends, the first power consumption control signal SanEn1 is adjusted from the first level state to the second level state, and the second power consumption control signal SanEn2 is adjusted from the second level state to the first level state. At this point, the first reference signal NCS is adjusted from the first voltage value Vt to the second voltage value Vss. If the target signal is pulled down, since the voltage in the bit line Bla and the first storage unit 41 is low, the voltage value may be quickly adjusted from the second voltage value Vss to the first voltage value Vt, and the stored data in the first storage unit 41 may be quickly restored to the lowest state.

The end time of the power saving mode may be equal to the disabling time of the first storage unit 41. The end of the power saving mode means the end of the signal writing-back stage. If the target signal is pulled down, the voltage in the first storage unit 41 is maintained at the first voltage value Vt which is lower than the reference voltage value, so the next data reading operation is not affected.

The amplification circuit 23 enters the pre-charging stage, the isolation power value VisoInt is first adjusted to the third voltage value VisoH and then decreased to the fourth voltage value VisoL, and the isolation control signal Iso is first adjusted to the third voltage value VisoH and then decreased to the fourth voltage value VisoL, thus saving the power consumption of the thirteenth switch tube 313 and the fourteenth switch tube 314, and prolonging the service life of the components. After the isolation control signal is adjusted to the fourth voltage value VisoL, the pre-charging signal Eq and the noise canceling signal Nc are adjusted to the first level state, at the same time, the first power consumption control signal SanEn1 is adjusted to the second level state, and the second power consumption control signal SanEn2 first raises to the first level state and then returns to the second level state. In this way, the first reference signal NCS decreases from the first voltage value Vt to the second voltage value Vss, and then increases to the reference voltage value, and the second reference signal PCS returns from the high reference potential to the fourth voltage value. The bit line Bla/the complementary bit line Blb, and the readout bit line saBla/the complementary readout bit line saBlb will return to the reference voltage value.

After the pre-charging stage ends, the amplification circuit 23 enters the standby stage again to prepare for the next operation.

Figure 13:
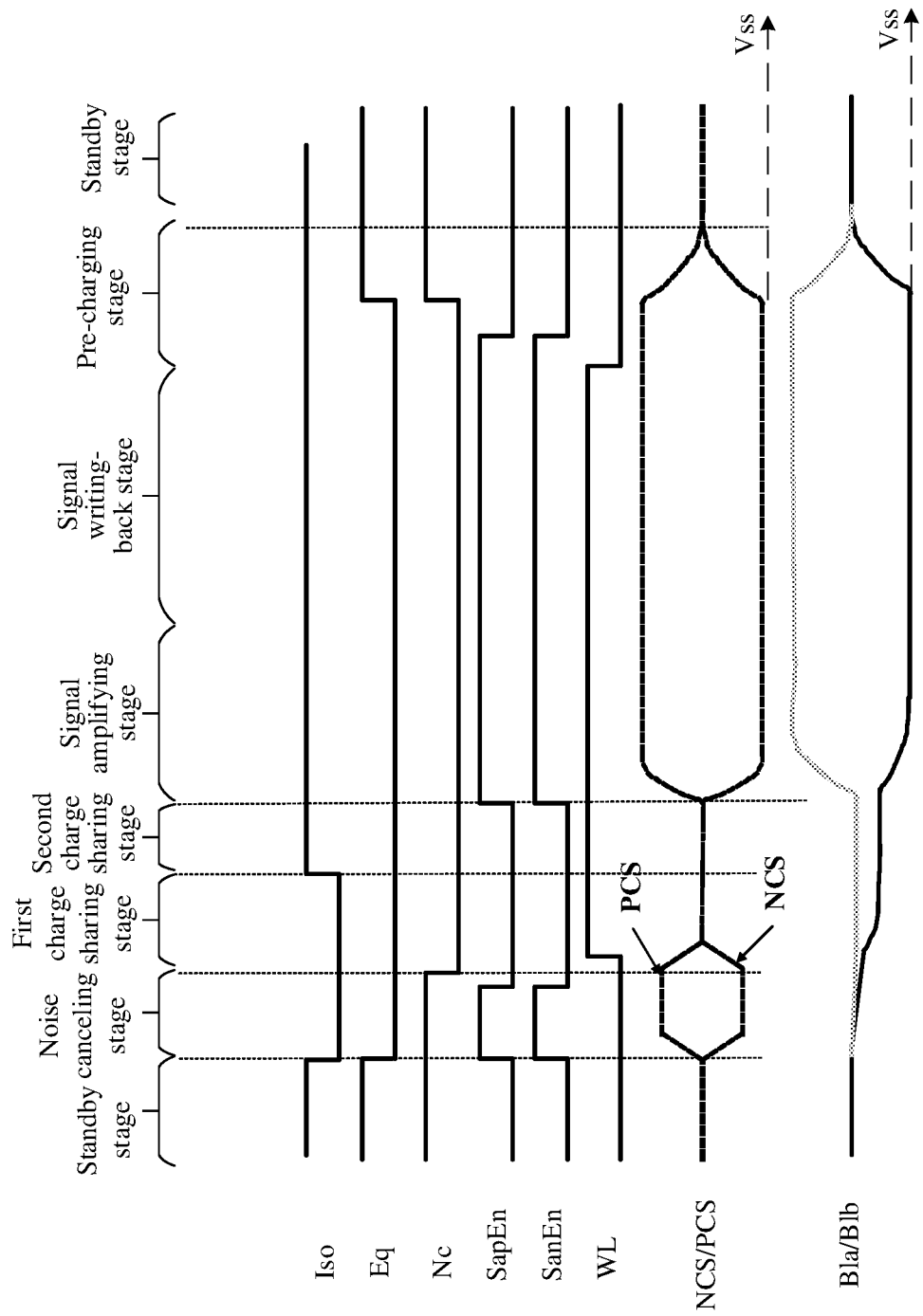
FIG. 13 illustrates a schematic diagram of signal sequence of another amplification circuit provided in embodiments of the disclosure.

In the related art, FIG. 13 illustrates a structural diagram of signal sequence provided in embodiments of the disclosure. Due to absence of the power consumption control circuit in the control amplification circuit of the related art, the first reference signal NCS can only be the voltage value Vss (namely the low reference potential) or the reference voltage value. In FIG. 13, SanEn is the first reference control signal. When the first reference control signal SanEn is in the first level state, the first reference signal NCS is the low reference potential. When the first reference control signal SanEn is in the second level state, the first reference signal NCS is the reference voltage value, and is indicated by the first reference control signal SanEn. The meaning and changing principle of other signals in FIG. 13 may be understood referring to FIG. 12, which will not be described here again. As illustrated in FIG. 13, on the one hand, the first reference signal NCS in the related art needs to maintain the second voltage value Vss when acting as the low reference potential, so the power consumption of the circuit cannot be reduced; on the other hand, the isolation power value (not shown) in the related art is a fixed voltage value, so the isolation control signal Iso has two voltage values, which belong to the first level state and the second level state respectively. The speed of signal amplification is slow and the circuit noise is large.

The embodiments of the disclosure provide a control amplification circuit and a control method thereof. It can be seen from the detailed elaboration of the specific implementations of the aforementioned embodiments that, on the one hand, in the pre-charging stage and the standby stage, the isolation power value decreases to the fourth voltage value VisoL, which can reduce the electric leakage and failure of the component and prolong the service life of the component; in the signal writing-back stage, the circuit may enter the power saving mode, which can reduce the electric leakage and failure of the component and prolong the service life of the component; after the circuit enters the power saving mode, the first reference signal NCS is the first voltage value Vt, so the amplification circuit 23 only needs to be pulled down to Vt instead of Vss, which can reduce the power consumption of the circuit. In addition, the power consumption control circuit may also reduce the noise during voltage drop; for example, by turning on the sub-circuit of a first power consumption circuit and then turning on the sub-circuit of a second power consumption circuit, a speed of voltage drop can be reduced, and noise is reduced.

Figure 14:
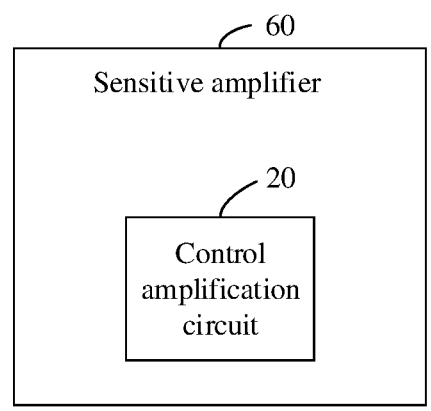
FIG. 14 illustrates a compositional structural diagram of a sensitive amplifier provided in embodiments of the disclosure.

In another embodiment of the disclosure, FIG. 14 illustrates a compositional structural diagram of a sensitive amplifier 60 provided in embodiments of the disclosure. As illustrated in FIG. 14, the sensitive amplifier 60 may include the control amplification circuit 20 described in any above embodiment.

In this way, because the sensitive amplifier 60 may include the control amplification circuit 20 described in any above embodiment, by providing a power consumption adjustment circuit, the specific voltage value of the first reference signal can be adjusted to reduce the power consumption of the circuit. At the same time, the specific voltage value of the isolation control signal can be adjusted through the isolating circuit, so the signal amplification process is optimized, not only alleviating the problem of low signal amplification speed, but also reducing the circuit noise.

Figure 15:
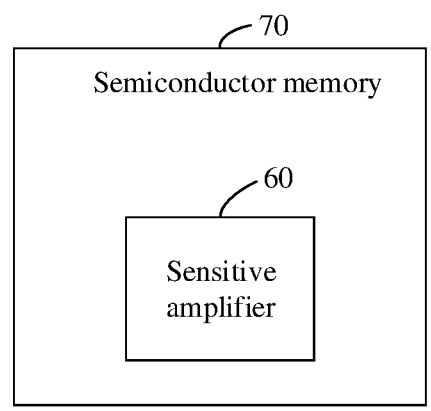
FIG. 15 illustrates a compositional structural diagram of a semiconductor memory provided in embodiments of the disclosure.

In yet another embodiment of the disclosure, FIG. 15 illustrates a compositional structural diagram of a semiconductor memory 70 provided in embodiments of the disclosure. As illustrated in FIG. 15, the semiconductor memory 70 may include the sensitive amplifier 60 described in any above embodiment.

In the embodiments of the disclosure, the semiconductor memory 70 may be a DRAM chip.

As such, because the semiconductor memory 70 includes the aforementioned sensitive amplifier 60, and the sensitive amplifier 60 may include the control amplification circuit 20 described in any above embodiment, by providing the power consumption adjustment circuit, the specific voltage value of the first reference signal can be adjusted to reduce the power consumption of the circuit. At the same time, the specific voltage value of the isolation control signal can be adjusted through the isolating circuit, so the signal amplification process is optimized, not only alleviating the problem of low signal amplification speed, but also reducing the circuit noise.

The above are merely the preferred embodiments of the disclosure and are not intended to limit the protection scope of the disclosure.

It is to be noted that terms "include" and "contain" or any other variant in the disclosure are intended to cover nonexclusive inclusions herein, so that a process, method, object or device including a series of components not only includes those components but also includes other components which are not clearly listed or further includes components intrinsic to the process, the method, the object or the device. Without more limitations, an element defined by the statement "including a/an . . ." does not exclude existence of the other identical components in a process, method, object or device including the component.

The sequence numbers of the embodiments of the disclosure are used for explanation only, but do not indicate merits of embodiments.

The features disclosed in some method embodiments provided in the disclosure may be freely combined without conflicts to obtain new method embodiments.

The features disclosed in some product embodiments provided in the disclosure may be freely combined without conflicts to obtain new product embodiments.

The features disclosed in some method or device embodiments provided in the disclosure may be freely combined without conflicts to obtain new method embodiments or device embodiments.

The above is only the detailed description of the disclosure, but the protection scope of the disclosure is not limited thereto. Any change or replacement easily conceivable by those skilled in the art within the scope of technologies disclosed by the disclosure shall fall within the protection scope of the disclosure. Therefore, the scope of protection of the disclosure shall be subject to the scope of protection of the claims.

INDUSTRIAL APPLICABILITY

The embodiments of the disclosure provide a control amplification circuit, a sensitive amplifier and a semiconductor memory. The control amplification circuit may include: a power consumption control circuit, an isolating circuit, and an amplification circuit. The power consumption control circuit is configured to receive a power consumption control signal and output a first reference signal according to the power consumption control signal. The isolating circuit is configured to determine a control instruction signal and generate an isolation control signal according to the control instruction signal. The amplification circuit is configured to receive the first reference signal, the isolation control signal and a signal to be processed, and process the signal to be processed based on the first reference signal and the isolation control signal to obtain a target amplified signal. In this way, by means of the control amplification circuit, the first reference signal can be adjusted according to the power consumption control signal, thus reducing the power consumption of the circuit.

The invention claimed is:

1. A control amplification circuit, comprising:
   a power consumption control circuit, configured to receive a power consumption control signal and output a first reference signal according to the power consumption control signal;
   an isolating circuit, configured to determine a control instruction signal and generate an isolation control signal according to the control instruction signal; and
   an amplification circuit, configured to receive the first reference signal, the isolation control signal and a signal to be processed, and process the signal to be processed based on the first reference signal and the isolation control signal to obtain a target amplified signal.

2. The control amplification circuit of claim 1, wherein the power consumption control circuit comprises a first control circuit and a second control circuit, and the power consumption control signal comprises a first power consumption control signal and a second power consumption control signal;
   the first control circuit is configured to receive the first power consumption control signal, and output the first reference signal with a first voltage value in response to that the first power consumption control signal is in a first level state,
   the second control circuit is configured to receive the second power consumption control signal, and output the first reference signal with a second voltage value when the second power consumption control signal is in the first level state, and
   the first voltage value is higher than the second voltage value.

3. The control amplification circuit of claim 2, wherein the first control circuit comprises multiple first control sub-circuits, and each of the first control sub-circuits comprises a first switch tube and a second switch tube;
   a first end of the first switch tube is configured to receive the first power consumption control signal, a third end of the first switch tube is connected to a first end of the second switch tube and a second end of the second switch tube, a third end of the second switch tube is connected to a ground signal, and second ends of second switch tubes in the multiple first control sub-circuits are connected with each other; and a second end of the first switch tube is configured to output the first reference signal.

4. The control amplification circuit of claim 3, wherein a switch is provided between the third end of the first switch tube and the first end of the second switch tube, and a control end of the switch is connected to a power saving control signal; and wherein in response to that the first power consumption control signal is in the first level state, the switch is controlled to be in a closed state by the power saving control signal.

5. The control amplification circuit of claim 3, wherein the second control circuit comprises multiple second control sub-circuits, and each of the second control sub-circuits comprises a third switch tube; and a first end of the third switch tube is configured to receive the second power consumption control signal, a third end of the third switch tube is connected to the ground signal, and a second end of the third switch tube is configured to output the first reference signal.

6. The control amplification circuit of claim 5, wherein the power consumption control circuit further comprises a control signal generation circuit, the control signal generation circuit comprises multiple first inverters, and each of the multiple first inverters is configured to receive a respective initial control signal and generate a respective power consumption control signal; the first power consumption control signal of each of the multiple first control sub-circuits is output through a respective one of the multiple first inverters, and the second power consumption control signal of each of the multiple second control sub-circuits is output through a respective one of the multiple first inverters.

7. The control amplification circuit of claim 1, further comprising a reference control circuit, wherein the reference control circuit is configured to determine a reference control signal and output a second reference signal according to the reference control signal; and the amplification circuit is further configured to receive the first reference signal, the second reference signal, the isolation control signal and the signal to be processed, and process the signal to be processed based on the first reference signal, the second reference signal and the isolation control signal to obtain the target amplified signal.

8. The control amplification circuit of claim 7, wherein the reference control circuit comprises multiple third control sub-circuits, and each of the third control sub-circuits comprises a respective fourth switch tube; and a first end of the respective fourth switch tube is connected to a respective reference control signal, a second end of the respective fourth switch tube is connected to a respective first preset power supply, and a third end of the respective fourth switch tube is configured to output the second reference signal.

9. The control amplification circuit of claim 7, wherein the reference control circuit comprises multiple signal processing sub-circuits and multiple third control sub-circuits;

each of the multiple signal processing sub-circuits comprises a respective second inverter, and the respective second inverter is configured to receive a respective initial reference signal and generate a respective reference control signal;

each of the multiple third control sub-circuits comprises a respective fourth switch tube, a first end of the respective fourth switch tube is connected to a respective reference control signal, a second end of the respective fourth switch tube is connected to a respective first preset power supply, and a third end of the respective fourth switch tube is configured to output the second reference signal; and the multiple signal processing sub-circuits and the multiple third control sub-circuits are in one-to-one correspondence.

10. The control amplification circuit of claim 1, wherein the isolating circuit comprises a first signal determination circuit, a power output circuit, a second signal determination circuit and an isolation control circuit;

the first signal determination circuit is configured to output, in response to receiving a preset operation instruction, at least one of a first power switching signal or a second power switching signal according to the preset operation instruction;

the power output circuit is configured to output an isolation power value according to the at least one of the first power switching signal or the second power switching signal;

the second signal determination circuit is configured to output, in response to receiving the preset operation instruction, the control instruction signal according to the preset operation instruction; and the isolation control circuit is configured to receive the isolation power value and the control instruction signal, and generate the isolation control signal.

11. The control amplification circuit of claim 10, wherein the power output circuit is configured to:

determine the isolation power value to be a third voltage value in response to that the first power switching signal is in a second level state and the second power switching signal is in a first level state; or determine the isolation power value to be a fourth voltage value in response to that the first power switching signal is in the first level state and the second power switching signal is in the second level state;

wherein both the third voltage value and the fourth voltage value belong to the first level state, and the third voltage value is greater than the fourth voltage value.

12. The control amplification circuit of claim 11, wherein the isolation control circuit is configured to:

determine the isolation control signal to have the third voltage value in response to that the control instruction signal is at the first level state and the isolation power value has the third voltage value; or determine the isolation control signal to have the fourth voltage value in response to that the control instruction signal is at the first level state and the isolation power value is at the fourth voltage value; or determine the isolation control signal to have a fifth voltage value in response to that the control instruction signal is at the second level state;

wherein the fifth voltage value belongs to the second level state, and the fifth voltage value is less than the fourth voltage value.

13. The control amplification circuit of claim 12, wherein the power output circuit comprises a second preset power supply, a third preset power supply, a fifth switch tube and a sixth switch tube;

a first end of the fifth switch tube is connected to the first power switching signal, and a first end of the sixth switch tube is connected to the second power switching signal;

a second end of the fifth switch tube is connected to the second preset power supply, and a second end of the sixth switch tube is connected to the third preset power supply;

a third end of the fifth switch tube is connected to a third end of the sixth switch tube, and is configured to output the isolation power value; and the second preset power supply is configured to output the third voltage value, and the third preset power supply is configured to output the fourth voltage value.

14. The control amplification circuit of claim 12, wherein the isolation control circuit comprises a third inverter, a seventh switch tube and an eighth switch tube;

an input end of the third inverter is connected to the control instruction signal, and an output end of the third inverter is connected to a first end of the seventh switch tube and a first end of the eighth switch tube respectively;

a second end of the seventh switch tube is connected to the isolation power value, and a third end of the eighth switch tube is connected to a ground signal; and a third end of the seventh switch tube is connected to a second end of the eighth switch tube, and is configured to output the isolation control signal.

15. The control amplification circuit of claim 12, wherein the amplification circuit comprises:

a ninth switch tube, a tenth switch tube, an eleventh switch tube, a twelfth switch tube, a thirteenth switch tube and a fourteenth switch tube;

a first end of the ninth switch tube is connected to a third end of the thirteenth switch tube, and is configured to receive the signal to be processed; a second end of the ninth switch tube, a third end of the eleventh switch tube and a first end of the twelfth switch tube are connected to a second end of the fourteenth switch tube;

a first end of the tenth switch tube is connected to a third end of the fourteenth switch tube, and is configured to receive the signal to be processed; a second end of the tenth switch tube, a third end of the twelfth switch tube and a first end of the eleventh switch tube are connected to a second end of the thirteenth switch tube; and a third end of the ninth switch tube and a third end of the tenth switch tube are connected to the first reference signal; a second end of the eleventh switch tube and a second end of the twelfth switch tube are connected to a second reference signal; and a first end of the thirteenth switch tube and a first end of the fourteenth switch tube are connected to the isolation control signal.

16. The control amplification circuit of claim 15, wherein the amplification circuit further comprises: a pre-charging circuit, and the pre-charging circuit comprises a fifteenth switch tube and a sixteenth switch tube;

a first end of the fifteenth switch tube and a first end of the sixteenth switch tube are connected to a pre-charging control signal;

a second end of the fifteenth switch tube is connected to a fourth preset power supply, and a third end of the fifteenth switch tube is connected to the second end of the tenth switch tube; and a second end of the sixteenth switch tube is connected to the second end of the tenth switch tube, and a third end of the sixteenth switch tube is connected to the second end of the ninth switch tube.

17. The control amplification circuit of claim 15, wherein the amplification circuit further comprises: a noise canceling circuit, and the noise canceling circuit comprises a seventeenth switch tube and an eighteenth switch tube;

a first end of the seventeenth switch tube and a first end of the eighteenth switch tube are connected to a noise canceling signal;

a second end of the seventeenth switch tube is connected to the second end of the ninth switch tube, and a third end of the seventeenth switch tube is connected to the first end of the ninth switch tube; and a second end of the eighteenth switch tube is connected to the second end of the tenth switch tube, and a third end of the eighteenth switch tube is connected to the first end of the tenth switch tube.

18. The control amplification circuit of claim 12, wherein a process that the amplification circuit processes the signal to be processed comprises: a standby stage, a noise canceling stage, a first charge sharing stage, a second charge sharing stage, a signal amplifying stage, a signal writing-back stage and a pre-charging stage;

when the amplification circuit is in one of the second charge sharing stage, the signal amplifying stage or the pre-charging stage, the isolation control signal is maintained to be at the third voltage value; or when the amplification circuit is in the standby stage or the signal writing back stage, the isolation control signal is maintained to be at the fourth voltage value; or when the amplification circuit is in the noise canceling stage or the first charge sharing stage, the isolation control signal is maintained to be at the fifth voltage value.

19. A sensitive amplifier, comprising a control amplification circuit, wherein the control amplification circuit comprises: a power consumption control circuit, configured to receive a power consumption control signal and output a first reference signal according to the power consumption control signal;

an isolating circuit, configured to determine a control instruction signal and generate an isolation control signal according to the control instruction signal; and an amplification circuit, configured to receive the first reference signal, the isolation control signal and a signal to be processed, and process the signal to be processed based on the first reference signal and the isolation control signal to obtain a target amplified signal.

20. A semiconductor memory, comprising a sensitive amplifier, wherein the sensitive amplifier comprises a control amplification circuit, and the control amplification circuit comprises: a power consumption control circuit, configured to receive a power consumption control signal and output a first reference signal according to the power consumption control signal;

an isolating circuit, configured to determine a control instruction signal and generate an isolation control signal according to the control instruction signal; and an amplification circuit, configured to receive the first reference signal, the isolation control signal and a signal to be processed, and process the signal to be processed based on the first reference signal and the isolation control signal to obtain a target amplified signal.

* * * * *